United States Patent
Vimercati et al.

(10) Patent No.: US 11,004,493 B1
(45) Date of Patent: May 11, 2021

(54) DIFFERENTIAL AMPLIFIER SENSING SCHEMES FOR NON-SWITCHING STATE COMPENSATION

(71) Applicant: Micron Technology, Inc., Boise, ID (US)

(72) Inventors: Daniele Vimercati, El Dorado Hills, CA (US); Xinwei Guo, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/705,055

(22) Filed: Dec. 5, 2019

(51) Int. Cl.
  *G11C 11/24* (2006.01)
  *G11C 11/22* (2006.01)
  *G11C 11/4091* (2006.01)
  *G11C 11/4094* (2006.01)

(52) U.S. Cl.
  CPC ........ *G11C 11/2273* (2013.01); *G11C 11/221* (2013.01); *G11C 11/2255* (2013.01); *G11C 11/4091* (2013.01); *G11C 11/4094* (2013.01)

(58) Field of Classification Search
  CPC .............. G11C 11/2273; G11C 11/221; G11C 11/4091; G11C 11/4094; G11C 11/2255
  See application file for complete search history.

(56) References Cited

U.S. PATENT DOCUMENTS

| | | | | |
|---|---|---|---|---|
| 5,270,967 A * | 12/1993 | Moazzami | ............. | G11C 11/22 365/145 |
| 6,163,475 A * | 12/2000 | Proebsting | ............. | G11C 7/065 257/E21.659 |
| 9,786,347 B1 | 10/2017 | Kawamura et al. | | |
| 9,997,232 B2 * | 6/2018 | Murphy | ................... | H04L 9/14 |
| 10,672,457 B2 * | 6/2020 | Vimercati | ........... | G11C 11/2257 |
| 10,692,564 B2 * | 6/2020 | Vimercati | ........... | G11C 11/4085 |
| 2020/0294573 A1 * | 9/2020 | Vimercati | ............. | G11C 11/221 |

* cited by examiner

*Primary Examiner* — Gene N Auduong
(74) *Attorney, Agent, or Firm* — Holland & Hart LLP

(57) ABSTRACT

Methods, systems, and devices for differential amplifier schemes for non-switching state compensation are described. During a read operation, a first node of a memory cell may be coupled with an input of differential amplifier while a second node of the memory cell may be biased with a first voltage (e.g., to apply a first read voltage across the memory cell). The second node of the memory cell may subsequently be biased with a second voltage (e.g., to apply a second read voltage across the memory cell), which may support the differential amplifier operating in a manner that compensates for a non-switching state of the memory cell. By compensating for a non-switching state of a memory cell during read operations, read margins may be increased.

25 Claims, 8 Drawing Sheets

DIFFERENTIAL AMPLIFIER SENSING SCHEMES FOR NON-SWITCHING STATE COMPENSATION

BACKGROUND

The following relates generally to one or more memory systems and more specifically to differential amplifier sensing schemes for non-switching state compensation in a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices may include increasing memory cell density, increasing read/write speeds, increasing reliability, increasing data retention, reducing power consumption, or reducing manufacturing costs, among other metrics. In some cases, various circuit components may be included between a memory cell and a sense amplifier to support developing a signal related to determining a logic state stored by a memory cell.

DETAILED DESCRIPTION

The logic state of a memory cell may be detected using a read operation that employs differential amplifier sensing schemes for non-switching state compensation. For example, a memory device may include an amplifier component coupled with or between a memory cell and a sense component. The amplifier component may, in some cases, include a differential amplifier, where a first input of the amplifier may be configured to be coupled with the memory cell and an output of the amplifier may be configured to be coupled with the sense component. In some examples, the differential amplifier may be configured such that a current at the output is proportional to a difference in voltage between the first input and a second input.

The amplifier component may include an integrator capacitor configured to be coupled with or between the output node of the differential amplifier and the first input of the amplifier. For example, a first node of the integrator capacitor may be coupled with the first input of the differential amplifier, and a switching component may be coupled between the output of the differential amplifier and a second node of the integrator capacitor. Thus, the amplifier component may provide a capacitive feedback line between the output and the first input, and the capacitive feedback line may be enabled or disabled by way of the switching component. In some examples, the amplifier component may also provide a selectable direct feedback line, where a switching component may be coupled with or between the output and the first input, and may be configured to selectively couple or decouple the output and the first input.

During a read operation, the integrator capacitor may be charged in a precharge operation, and then coupled with the output of the differential amplifier and the first input of the differential amplifier. A first node of a memory cell may be coupled with the first input of the differential amplifier while a second node of the memory cell is biased with a first voltage, and the second node of the memory cell may subsequently be biased with a second voltage to compensate for a non-switching state of the memory cell. While the second node of the memory cell is biased with the second voltage, the output of the differential amplifier may then be coupled with a sense component, and the differential amplifier may provide a sense signal to the sense component that is based on the logic state stored by the memory cell. By compensating for (e.g., reducing, eliminating) a non-switching state of a memory cell during read operations, read margins may be improved compared to memory devices that may not employ such techniques for non-switching state compensation.

Figure 1:
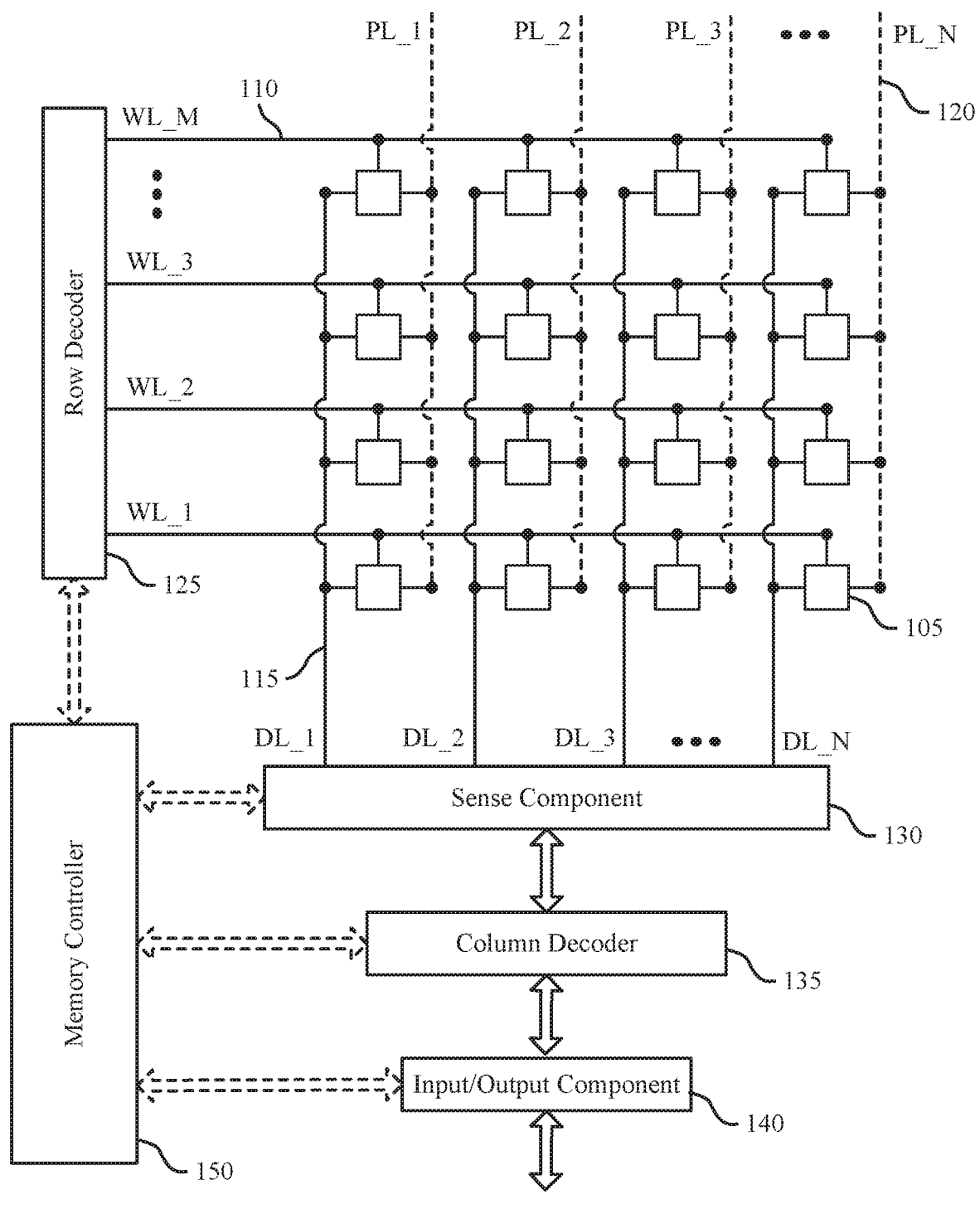
FIG. 1 illustrates an example of a memory device that supports differential amplifier sensing schemes for non-switching state compensation in accordance with examples as disclosed herein.
Figure 2:
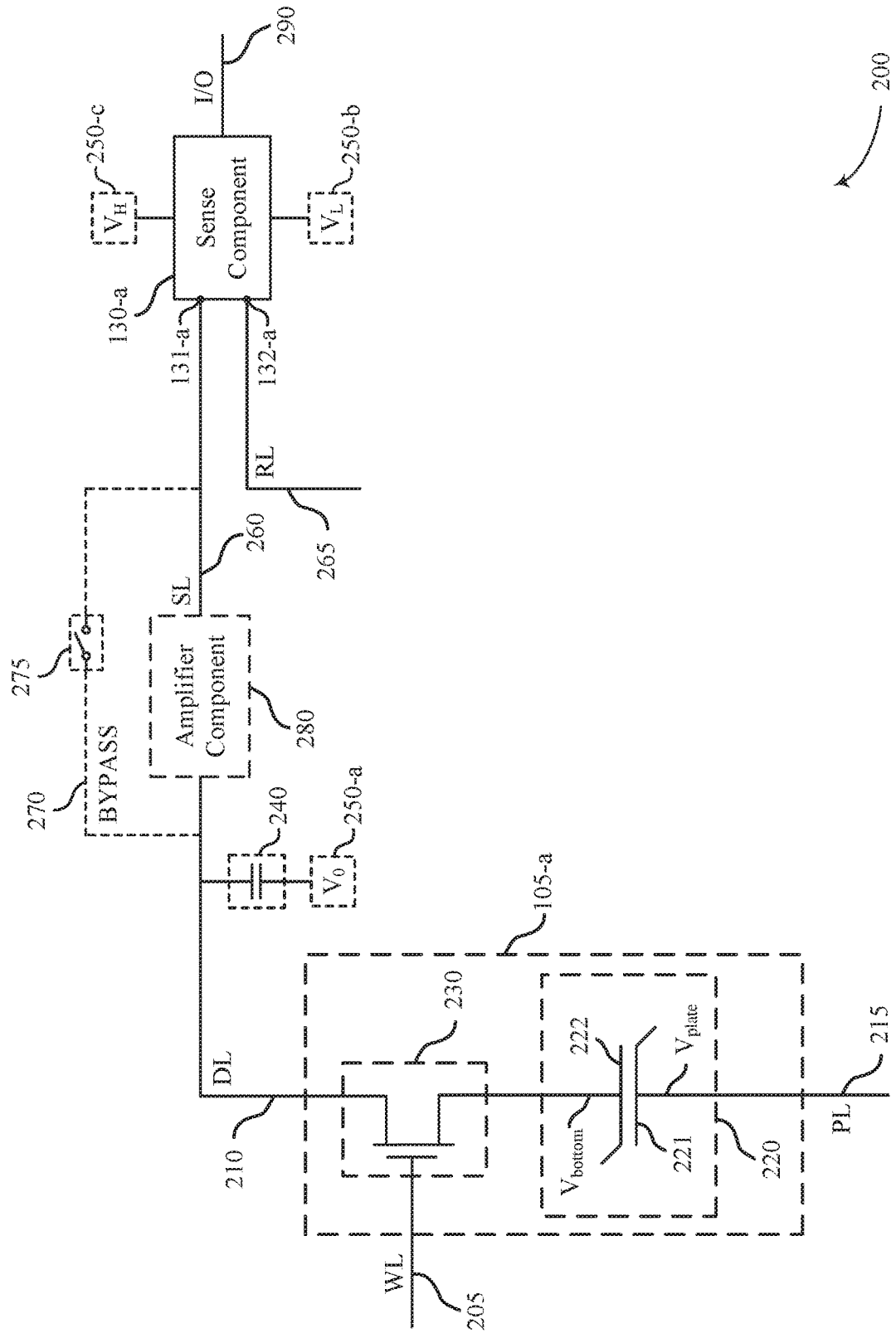
FIG. 2 illustrates an example circuit that supports differential amplifier sensing schemes for non-switching state compensation in accordance with examples as disclosed herein.
Figure 3:
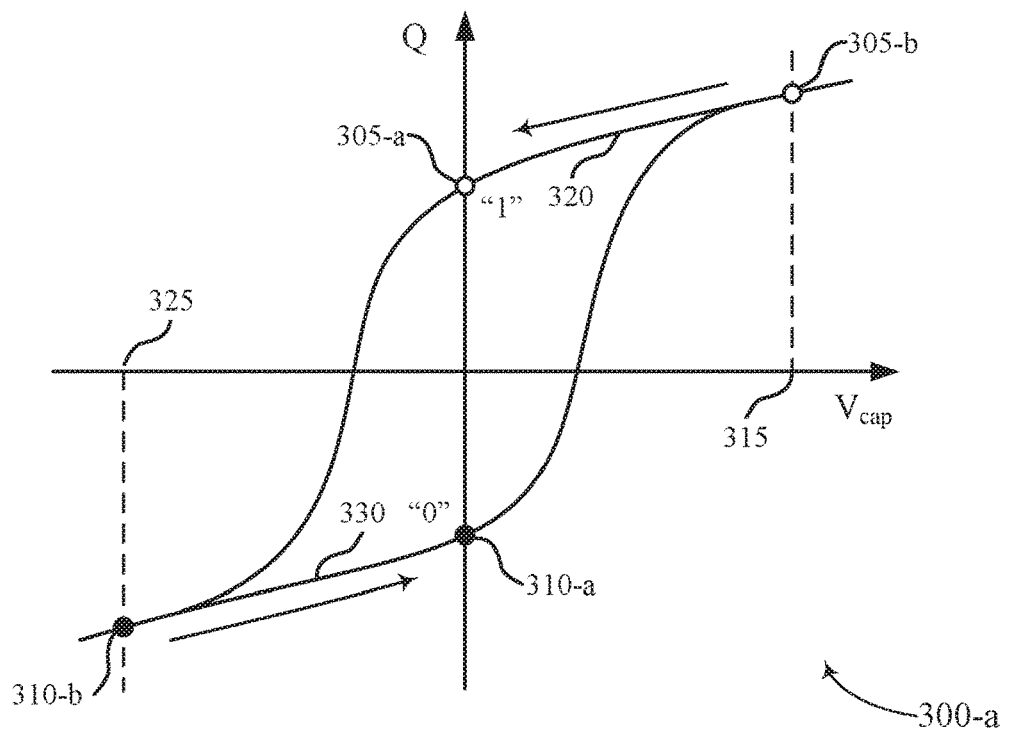
FIG. 3 illustrates an example of non-linear electrical properties with hysteresis plots for a memory cell that supports differential amplifier sensing schemes for non-switching state compensation in accordance with examples as disclosed herein.
Figure 3:
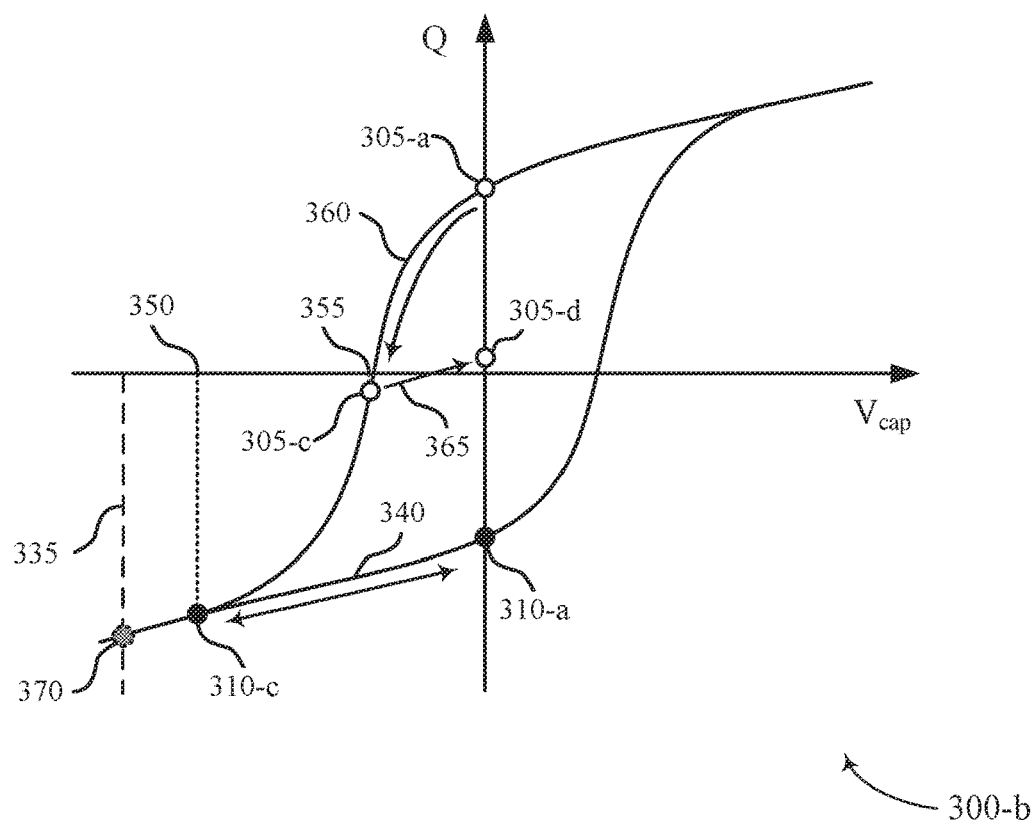

Features of the disclosure introduced above are further described with respect to FIGS. 1 through 3 in the context of memory arrays, memory circuits, and memory cell behaviors that support differential amplifier schemes for sensing memory cells. Specific examples are then described with respect to FIGS. 4 and 5, which illustrate a particular circuit with associated read operation timing diagrams that support differential amplifier schemes for sensing memory cells. These and other features of the disclosure are further described with respect to FIGS. 6 through 8, which illustrate apparatus diagrams, system diagrams, and flowcharts that support differential amplifier schemes for sensing memory cells.

FIG. 1 illustrates an example of a memory device 100 that supports differential amplifier sensing schemes for non-switching state compensation in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states. In various examples, the memory cells 105 may include a capacitive memory element, a ferroelectric memory element, a resistive element, or a self-selecting memory (e.g., SSM) element.

In some examples, a memory cell 105 may store an electric charge representative of the programmable logic states (e.g., storing charge in a capacitor). In one example, a charged and uncharged capacitor may represent two logic states, respectively. In another example, a positively and negatively charged capacitor may represent two logic states, respectively. DRAM or FeRAM architectures may use such designs, and the capacitor employed may include a dielectric material with linear or para-electric electric polarization properties as an insulator. In some examples, different levels of charge of a capacitor may represent different logic states (e.g., supporting more than two logic states in a respective memory cell 105). In some examples, such as FeRAM architectures, a memory cell 105 may include a ferroelectric capacitor having a ferroelectric material as an insulating layer between terminals of the capacitor. Different levels of polarization of a ferroelectric capacitor may represent different logic states (e.g., supporting two or more logic states in a respective memory cell 105). Ferroelectric materials have non-linear polarization properties including those discussed in further detail with reference to FIG. 3.

In some examples, a memory cell 105 may include a material portion, which may be referred to as a memory element, a memory storage element, a self-selecting memory element, or a self-selecting memory storage element. The material portion may have a variable and configurable electrical resistance or thresholding characteristic that is representative of different logic states.

9 For example, a material that can take the form of a crystalline atomic configuration or an amorphous atomic configuration (e.g., able to maintain either a crystalline state or an amorphous state over an ambient operating temperature range of the memory device 100) may have different electrical resistances depending on the atomic configuration. A more-crystalline state of the material (e.g., a single crystal, a collection of a relatively large crystal grains that is substantially crystalline) may have a relatively low electrical resistance, and may alternatively be referred to as a "SET" logic state. A more-amorphous state of the material (e.g., an entirely amorphous state, some distribution of relatively small crystal grains that is substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting two or more logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage, where electrical current flows through the memory element when the threshold voltage is exceed across the memory element. When a voltage applied across the memory element in the more-amorphous state is less than the threshold voltage, current may not flow through the memory element. In some cases, a memory element in the more-crystalline state may not be associated with a threshold voltage (e.g., may be associated with a threshold voltage of zero), and a current may flow through the memory element in response to a non-zero voltage across the memory element. In some cases, a material in both the more-amorphous state and the more-crystalline state may be associated with threshold voltages. For example, SSM may enhance differences in a threshold voltage of the memory cell between different programmed states (e.g., by way of different compositional distributions). The logic state of a memory cell 105 having such a memory element may be set by heating the memory element to a temperature profile over time that supports forming a particular atomic configuration, or combination of atomic configurations.

A memory device 100 may include a three-dimensional (3D) memory array, where a plurality of two-dimensional (2D) memory arrays (e.g., decks, levels) are formed on top of one another. Such an arrangement may increase the number of memory cells 105 that may be placed or created on a single die or substrate as compared with 2D arrays, which in turn may reduce production costs or increase the performance of a memory device 100, or both. The decks may be separated by an electrically insulating material. Each deck or level may be aligned or positioned so that memory cells 105 may be approximately aligned with one another across each deck, forming a stack of memory cells 105.

In the example of memory device 100, each row of memory cells 105 is coupled with one of a plurality of first access lines 110 (e.g., a word line (WL), such as one of WL_1 through WL_M), and each column of memory cells 105 is coupled with one of a plurality of second access lines 115 (e.g., a digit line (DL), such as one of DL_1 through DL_N). In some cases, first access lines 110 and second access lines 115 may be substantially perpendicular to one another in the memory device 100 (e.g., when viewing a plane of a deck of the memory device 100, as shown in FIG. 1). References to word lines and bit lines, or their analogues, are interchangeable without loss of understanding or operation.

In general, one memory cell 105 may be located at the intersection of (e.g., coupled with, coupled between) an access line 110 and an access line 115. This intersection may be referred to as an address of a memory cell 105. A target memory cell 105 may be a memory cell 105 located at the intersection of an energized or otherwise selected access line 110 and an energized or otherwise selected access line 115. In other words, an access line 110 and an access line 115 may be energized or otherwise selected to access (e.g., mad, write) a memory cell 105 at their intersection. Other memory cells 105 that are in electronic communication with (e.g., connected to) the same access line 110 or 115 may be referred to as untargeted memory cells 105.

Although the access lines described with reference to FIG. 1 are shown as direct lines between memory cells 105 and coupled components, access lines may include other circuit elements, such as capacitors, resistors, transistors, amplifiers, voltage sources, switching components, selection components, and others, which may be used to support access operations including those described herein. In some examples, an electrode may be coupled with (e.g., between) a memory cell 105 and an access line 110, or with (e.g., between) a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory device 100.

In some architectures, the logic storing component (e.g., a capacitive memory element, a ferroelectric memory element, a resistive memory element, other memory element) of a memory cell 105 may be electrically isolated from a second access line 115 by a cell selection component. A first access line 110 may be coupled with and may control the cell selection component of the memory cell 105. For example, the cell selection component may be a transistor and the first access line 110 may be coupled with a gate of the transistor. Activating the first access line 110 of a memory cell 105 may result in an electrical connection or closed circuit between the logic storing component of the memory cell 105 and its corresponding second access line 115. The second access line 115 may then be accessed to read or write the memory cell 105.

In some examples, memory cells 105 may also be coupled with one of a plurality of third access lines 120 (e.g., a plate line (PL), such as one of PL_1 through PL_N). In some examples, the plurality of third access lines 120 may couple memory cells 105 with one or more voltage sources for various sensing and/or writing operations including those described herein. For example, when a memory cell 105 employs a capacitor for storing a logic state, a second access line 115 may provide access to a first terminal of the capacitor, and a third access line 120 may provide access to a second terminal of the capacitor (e.g., a terminal associated with an opposite plate of the capacitor as opposed to the first terminal of the capacitor, a terminal otherwise on the opposite side of a capacitance from the first terminal of the capacitor).

Although the plurality of third access lines 120 of the memory device 100 are shown as substantially parallel with the plurality of second access lines 115 (e.g., where each of the third access lines 120 may correspond to a respective one of the second access lines 115), in other examples, a plurality of third access lines 120 may be substantially parallel with the plurality of first access lines 110 (e.g., where each of the third access lines 120 may correspond to a respective one of the first access lines 110), or in any other configuration.

Further, although illustrated as separate lines (e.g., independently-addressable third access lines 120), in some examples, the plurality of third access lines 120 may represent or be otherwise functionally equivalent with a common plate line, a common plate, or other common node of a section of the memory device 100 (e.g., a node common to each of the memory cells 105 in the section of the memory device 100), or other common node of the memory device 100.

Access operations such as reading, writing, and rewriting may be performed on a memory cell 105 by activating or selecting a first access line 110, a second access line 115, and/or a third access line 120 coupled with the memory cell 105, which may include applying a voltage, a charge, or a current to the respective access line. Access lines 110, 115, and 120 may be made of conductive materials, such as metals (e.g., copper (Cu), silver (Ag), aluminum (Al), gold (Au), tungsten (W), titanium (Ti)), metal alloys, carbon, or other conductive or semi-conductive materials, alloys, or compounds. Upon selecting a memory cell 105, a resulting signal may be used to determine the stored logic state. For example, a memory cell 105 with a capacitive memory element storing a logic state may be selected, and the resulting flow of charge via an access line (e.g., charge sharing) and/or resulting voltage of an access line may be detected to determine the programmed logic state stored by the memory cell 105.

Accessing memory cells 105 may be controlled through a row decoder 125 and a column decoder 135. For example, a row decoder 125 may receive a row address from the memory controller 150 and activate the appropriate first access line 110 based on the received row address. Similarly, a column decoder 135 may receive a column address from the memory controller 150 and activate the appropriate second access line 115. Thus, in some examples, a memory cell 105 may be accessed by activating a first access line 110 and a second access line 115.

In some examples, the memory controller 150 may control the operation (e.g., read operations, write operations, rewrite operations, refresh operations, discharge operations) of memory cells 105 through the various components (e.g., row decoder 125, column decoder 135, sense component 130). In some cases, one or more of the row decoder 125, column decoder 135, and sense component 130 may be co-located or otherwise included with the memory controller 150. The memory controller 150 may generate row and column address signals to activate a desired access line 110 and access line 115. The memory controller 150 may also generate or control various voltages or currents used during the operation of memory device 100. For example, the memory controller 150 may apply a discharge voltage to an access line 110 or an access line 115 after accessing one or more memory cells 105.

In general, the amplitude, shape, or duration of an applied voltage, current, or charge may be adjusted or varied, and may be different for the various operations discussed in operating the memory device 100. Further, one, multiple, or all memory cells 105 within memory device 100 may be accessed simultaneously. For example, multiple or all memory cells 105 of memory device 100 may be accessed simultaneously during a reset operation in which all memory cells 105, or a group of memory cells 105, are set to a single logic state.

A memory cell 105 may be read (e.g., sensed) by a sense component 130 when the memory cell 105 is accessed (e.g., in cooperation with the memory controller 150) to determine a logic state stored by the memory cell 105. For example, the sense component 130 may be configured to sense a current or charge through the memory cell 105, or a voltage resulting from coupling the memory cell 105 with the sense component 130 or other intervening component (e.g., a signal development circuit between the memory cell and the sense component 130), responsive to a read operation. The sense component 130 may provide an output signal indicative of the logic state stored by the memory cell 105 to one or more components (e.g., to the column decoder 135, the input/output component 140, the memory controller 150).

In some examples, after accessing the memory cell 105, the logic storage portion of memory cell 105 may discharge, or otherwise permit electrical charge or current to flow via its corresponding access line 115. Such charge or current may result from biasing, or applying a voltage, to the memory cell 105 from one or more voltage sources or supplies (not shown) of the memory device 100, where such voltage sources or supplies may be part of the sense component 130, the memory controller 150, or some other component (e.g., a biasing component). In some examples, a discharge of a memory cell 105 may cause a change in the voltage of the access line 115, which the sense component 130 may compare to a reference voltage to determine the stored state of the memory cell 105. In some examples, a voltage may be applied to a memory cell 105 (e.g., using the corresponding access line 115 or access line 120) and the presence of a resulting current may depend on the applied voltage and the resistance state of a memory element of the memory cell 105, which the sense component 130 may use to determine the stored state of the memory cell 105

In some examples, when a read pulse (e.g., a read voltage) is applied across a memory cell 105 with a memory element storing a first logic state (e.g., a SET state, associated with a more-crystalline atomic configuration), the memory cell conducts current due to the read pulse exceeding a threshold voltage of the memory cell 105. In response or based on this, the sense component 130 may therefore detect a current through the memory cell 105 as part of determining the stored logic state. When a read pulse is applied to the memory cell 105 with the memory element storing a second logic state (e.g., a RESET state, associated with an more-amorphous atomic configuration), which may occur before or after the application of a read pulse across a memory cell 105 with a memory element storing a first logic state, the memory cell 105 may not conduct current due to the read pulse not exceeding the threshold voltage of the memory cell. The sense component 130 may therefore detect little or no current through the memory cell 105 as part of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 110 or 115. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some examples, more than one voltage may be applied when reading a memory cell 105 (e.g., multiple voltages may be applied as part of a read operation). For example, if an applied read voltage does not result in current flow, one or more other read voltages may be applied (e.g., until a current is detected by sense component 130). Based on assessing the read voltage that resulted in current flow, the stored logic state of the memory cell 105 may be determined. In some cases, a read voltage may be ramped (e.g., smoothly increasing higher in magnitude) until a current flow or other condition is detected by a sense component 130. In other cases, predetermined read voltages may be applied (e.g., a predetermined sequence of read voltages that increase higher in magnitude in a stepwise manner) until a current is detected. Likewise, a read current may be applied to a memory cell 105 and the magnitude of the voltage to create the read current may depend on the electrical resistance or the total threshold voltage of the memory cell 105.

A sense component 130 may include various switching components, selection components, transistors, amplifiers, capacitors, resistors, or voltage sources to detect and amplify a difference in sensing signals (e.g., a difference between a read voltage and a reference voltage, a difference between a read current and a reference current, a difference between a read charge and a reference charge), which, in some examples, may be referred to as latching. In some examples, a sense component 130 may include a collection of components (e.g., circuit elements) that may be repeated for each of a set of access lines 115 connected to the sense component 130. For example, a sense component 130 may include a separate sensing circuit (e.g., a separate sense amplifier, a separate signal development circuit) for each of a set of access lines 115 coupled with the sense component 130, such that a logic state may be separately detected for a respective memory cell 105 coupled with a respective one of the set of access lines 115. In various examples, a reference signal source or generated reference signal may be shared between components of the memory device 100 (e.g., shared among one or more sense components 130, shared among separate sensing circuits of a sense component 130).

The sense component 130 may be included in a device that includes the memory device 100. For example, the sense component 130 may be included with other read and write circuits, decoding circuits, or register circuits of the memory that may be coupled to the memory device 100. In some examples, the detected logic state of a memory cell 105 may be output through a column decoder 135 or an input/output component 140 as an output. In some examples, a sense component 130 may be part of a column decoder 135 or a row decoder 125. In some examples, a sense component 130 may be connected to or otherwise in electronic communication with a column decoder 135 or a row decoder 125.

In some memory architectures, accessing the memory cell 105 may degrade or destroy the stored logic state and re-write or refresh operations may be performed to return the original logic state to memory cell 105. In DRAM or FeRAM, for example, a capacitor of a memory cell 105 may be partially or completely discharged during a sense operation, thereby corrupting the logic state that was stored in the memory cell 105. In PCM, for example, sense operations may cause a change in the atomic configuration of a memory cell 105, thereby changing the resistance state or thresholding characteristic of the memory cell 105. Thus, in some examples, the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row, all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in various examples, refreshing the logic state of the memory cell 105 may or may not be needed in the absence of access operations. For example, the logic state stored by a memory cell 105 may be refreshed at periodic intervals by applying an appropriate write or refresh pulse to maintain the stored logic state. Refreshing the memory cell 105 may reduce or eliminate read disturb errors or logic state corruption due to a charge leakage or a change in an atomic configuration of a memory element over time.

A memory cell 105 may also be set, or written, by activating the relevant first access line 110, second access line 115, and/or third access line 120. In other words, a logic state may be stored in the memory cell 105. Column decoder 135 or row decoder 125 may accept data, for example via input/output component 140, to be written to the memory cells 105. In various examples, a write operation may be performed at least in part by a sense component 130, or a write operation may be configured to bypass a sense component 130.

In the case of a capacitive memory element, a memory cell 105 may be written by applying a voltage to the capacitor, and then isolating the capacitor (e.g., isolating the capacitor from a voltage source used to write the memory cell 105) to store a charge in the capacitor associated with a desired logic state. In the case of ferroelectric memory, a ferroelectric memory element (e.g., a ferroelectric capacitor) of a memory cell 105 may written by applying a voltage with a magnitude high enough to polarize the ferroelectric memory element (e.g., applying a saturation voltage) with a polarization associated with a desired logic state, and the ferroelectric memory element may be isolated (e.g., floating), or a zero net voltage may be applied across the ferroelectric memory element (e.g., grounding, virtually grounding the ferroelectric memory element). In the case of PCM, a memory element may be written by applying a current with a profile that causes (e.g., by way of heating and cooling) the memory element to form an atomic configuration associated with a desired logic state.

In various examples in accordance with the present disclosure, an amplifier component (not shown) may be provided, such as an amplifier component in a signal development circuit between a memory cell 105 and a sense component 130, or a signal development portion of a sense component 130, to support the generation of sensing signals used to determine a logic state stored by a memory cell 105. The amplifier component may include a differential amplifier having two input nodes (e.g., two input terminals) and an output node (e.g., an output terminal). A first of the input nodes may be configured to be coupled with a memory cell 105 (e.g., via an access line 115) and the output node may be configured to be coupled with a portion of the sense component 130 (e.g., a sense amplifier or other latching component of the sense component 130). In some examples, the differential amplifier may be configured such that a current at the output node is proportional to a difference in voltage between the two input nodes of the differential amplifier. In various examples, the amplifier component may be coupled with or between a memory cell 105 (e.g., one or more of a plurality of memory cells 105 along an access line 115) and a sense component 130, or the amplifier component may be a portion of a sense component 130, which may or may not be electrically equivalent.

The amplifier component may also include a capacitor having two nodes (e.g., nodes associated with opposite plates of the capacitor, nodes otherwise on opposite sides of a capacitance), where a first node of the capacitor is coupled with the first input node. The amplifier component may also include a switching component or a selection component configured to selectively couple or decouple a second node of the capacitor with the output node of the differential amplifier. In other words, the amplifier component may include a capacitive feedback line between the output node of the differential amplifier and the first input node of the differential amplifier, and the capacitive feedback line may be selectively enabled or disabled by way of the switching component or selection component. In some examples, a switching component or a selection component may support charging the capacitor (e.g., precharging the capacitor) prior to coupling the amplifier component for developing a sensing signal to determine a logic state stored by a memory cell 105.

In some examples, the amplifier component may also include a switching component configured to selectively couple the output node with the first input node. In other words, the amplifier component may include a direct feedback line between the output node of the differential amplifier and the first input node of the differential amplifier, and the direct feedback line may be enabled or disabled by way of the switching component.

By including an amplifier component such as those described herein, the memory device 100 may support particular methods (e.g., techniques) for sensing a logic state stored by a memory cell 105. For example, a method of sensing a logic state may include precharging a capacitor (e.g., while a first node of the capacitor is coupled with a first input node of the differential amplifier), and coupling a second node of the capacitor with the output node of the differential amplifier after precharging the capacitor. The method may also include coupling a first node of a memory cell 105 (e.g., via an access line 115) with the first input node of the differential amplifier while a second node of the memory cell 105 is biased with a first voltage. The second node of the memory cell 105 may then be biased with a second voltage to compensate for a non-switching state of the memory cell. While the second node of the memory cell is biased with the second voltage, the output of the differential amplifier may be coupled with a sense component (e.g., a sense amplifier, a latch), and the differential amplifier may send a sense signal to the sense component that is based on the logic state stored by the memory cell. A logic state stored by the memory cell 105 may be determined based at least in part on the generated sense signal. By compensating for (e.g., reducing, eliminating) a non-switching state of a memory cell during one or more operations, such as read operations, margins may be improved compared to memory devices that may not employ such techniques for non-switching state compensation.

FIG. 2 illustrates an example circuit 200 that supports differential amplifier sensing schemes for non-switching state compensation in a memory device in accordance with examples as disclosed herein. Circuit 200 may include a memory cell 105-a and a sense component 130-a, which may be examples of a memory cell 105 and a sense component 130 described with reference to FIG. 1. Circuit 200 may also include a word line 205, a digit line 210, and a plate line 215, which, in some examples, may correspond to a first access line 110, a second access line 115, and a third access line 120, respectively, as described with reference to FIG. 1. The circuit 200 may also include a reference line 265 used by the sense component 130-a to determine a stored logic state of the memory cell 105-a.

As illustrated in FIG. 2, the sense component 130-a may include a first node 131-a and a second node 132-a, which in various examples may be coupled with different access lines of a circuit (e.g., a signal line 260 and a reference line 265 of circuit 200, respectively) or a common access line of a different circuit (not shown). However, other configurations of access lines and/or reference lines are possible in accordance with various examples as disclosed herein.

Memory cell 105-a may include a logic storage component (e.g., a memory element), such as capacitor 220 that has a first plate, cell plate 221, and a second plate, cell bottom 222. The cell plate 221 and the cell bottom 222 may be capacitively coupled through a dielectric material positioned between them (e.g., in a DRAM application), or capacitively coupled through a ferroelectric material positioned between them (e.g., in a FeRAM application). The cell plate 221 may be associated with a voltage $V_{plate}$, and cell bottom 222 may be associated with a voltage $V_{bottom}$, as illustrated in the circuit 200. The orientation of cell plate 221 and cell bottom 222 may be different (e.g., flipped) without changing the operation of the memory cell 105-a. The cell plate 221 may be accessed via the plate line 215 and cell bottom 222 may be accessed via the digit line 210. As described herein, various states may be stored by charging, discharging, and/or polarizing the capacitor 220.

The capacitor 220 may be electrically connected with the digit line 210, and the stored logic state of capacitor 220 may be read or sensed by operating various elements represented in circuit 200. For example, the memory cell 105-a may also include a cell selection component 230 which, in some examples, may be referred to as a switching component or a selector device coupled with or between an access line (e.g., the digit line 210) and the capacitor 220. In some examples, a cell selection component 230 may be considered to be outside the illustrative boundary of the memory cell 105-a, and the cell selection component 230 may be referred to as a switching component or selector device coupled with or between an access line (e.g., the digit line 210) and the memory cell 105-a. The capacitor 220 can be coupled with digit line 210 when cell selection component 230 is activated (e.g., by way of an activating logical signal), and the capacitor 220 can be isolated from digit line 210 when cell selection component 230 is deactivated (e.g., by way of a deactivating logical signal).

Activating the cell selection component 230 may be referred to as selecting the memory cell 105-a in some examples, and deactivating the cell selection component 230 may be referred to as deselecting the memory cell 105-a in some examples. In some examples, the cell selection component 230 is a transistor and its operation is controlled by applying an activation voltage to the transistor gate, where the voltage for activating the transistor (e.g., the voltage between the transistor gate terminal and the transistor source terminal) is greater than the threshold voltage magnitude of the transistor. The word line 205 may be used to activate the cell selection component 230. For example, a selection voltage applied to the word line 205 (e.g., a word line logical signal) may be applied to the gate of a transistor of cell selection component 230, which may connect the capacitor 220 with the digit line 210 (e.g., providing a conductive path between the capacitor 220 and the digit line 210).

In other examples, the positions of the cell selection component 230 and the capacitor 220 in the memory cell 105-a may be switched, such that cell selection component 230 is coupled with or between the plate line 215 and the cell plate 221, and the capacitor 220 is coupled with or between the digit line 210 and the other terminal of the cell selection component 230. In such an example, the cell selection component 230 may remain in electronic communication with the digit line 210 through the capacitor 220. This configuration may be associated with alternative timing and biasing for access operations.

In examples that employ a ferroelectric capacitor 220, the capacitor 220 may or may not fully discharge upon connection to the digit line 210. In various schemes, to sense the logic state stored by a ferroelectric capacitor 220, a voltage may be applied to the plate line 215 and/or the digit line 210, and the word line 205 may be biased to select the memory cell 105-a. In some cases, the plate line 215 and/or the digit line 210 may be virtually grounded and then isolated from the virtual ground, which may be referred to as a floating condition, prior activating the word line 205.

Operation of the memory cell 105-a by varying the voltage to cell plate 221 (e.g., via the plate line 215) may be referred to as "moving the cell plate." Biasing the plate line 215 and/or the digit line 210 may result in a voltage difference (e.g., the voltage of the digit line 210 minus the voltage of the plate line 215) across the capacitor 220. The voltage difference may accompany a change in the stored charge on capacitor 220, where the magnitude of the change in stored charge may depend on the initial state of the capacitor 220 (e.g., whether the initial logic state stored a logic 1 or a logic 0). In some schemes, the change in stored charge of the capacitor 220 may cause a change in the voltage of the digit line 210, which may be used by the sense component 130-a to determine the stored logic state of the memory cell 105-a.

The digit line 210 may be coupled with many memory cells 105, and the digit line 210 may have properties that result in a non-negligible intrinsic capacitance 240 (e.g., on the order of picofarads (pF)), which may couple the digit line 210 with a voltage source 250-a. The voltage source 250-a may represent a common ground or virtual ground voltage, or the voltage of an adjacent access line of the circuit 200 (not shown). Although illustrated as a separate component in FIG. 2, the intrinsic capacitance 240 may be associated with properties distributed throughout the digit line 210.

In various examples, the intrinsic capacitance 240 may depend on physical characteristics of the digit line 210, including conductor dimensions (e.g., length, width, thickness) of the digit line 210. The intrinsic capacitance 240 may also depend on characteristics of adjacent access lines or circuit components, proximity to such adjacent access lines or circuit components, or insulation characteristics between the digit line 210 and such access lines or circuit components. Thus, a change in voltage of digit line 210 after selecting the memory cell 105-a may depend on the net capacitance of (e.g., associated with) the digit line 210. In other words, as charge flows along the digit line 210, some finite charge may be stored in the digit line 210 (e.g., in the intrinsic capacitance 240, other capacitance coupled with the digit line 210), and the resulting voltage of the digit line 210 may depend on the net capacitance of the digit line 210.

The resulting voltage of the digit line 210 after selecting the memory cell 105-a may be compared to a reference (e.g., a voltage of the reference line 265) by the sense component 130-*a* to determine the logic state that was stored in the memory cell 105-*a*. Other operations may be used to support selecting and/or sensing the memory cell 105-*a*, including operations for supporting differential amplifier schemes for sensing memory cells as described herein.

In some examples, the circuit 200 may include an amplifier component 280, which may be an example of a signal development circuit coupled with or between the memory cell 105-*a* and the sense component 130-*a*. The amplifier component 280 may amplify or otherwise convert signals of the digit line 210 before a sensing operation. The amplifier component 280 may include, for example, a transistor, a cascode, or any other charge or voltage amplifier. In some examples, the amplifier component 280 may include a charge transfer sensing amplifier (CTSA). In some examples with an amplifier component 280, a line between the sense component 130-*a* and the amplifier component 280 may be referred to as a signal line (e.g., signal line 260). In some examples (e.g., examples with or without an amplifier component 280), the digit line 210 may connect directly with the sense component 130-*a*. In some examples, the reference line 265 may also be connected with the amplifier component 280, such as when the amplifier component 280 provides a signal and a reference for the sense component 130-*a* to determine a logic state stored by the memory cell 105-*a*

In some examples, the circuit 200 may include a bypass line 270 that may permit selectively bypassing the amplifier component 280 or some other signal generation circuit between the memory cell 105-*a* and the sense component 130-*a*. In some examples, the bypass line 270 may be selectively enabled by way of a switching component 275. In other words, when the switching component 275 is activated, the digit line 210 may be coupled with the signal line 260 via the bypass line (e.g., coupling the memory cell 105-*a* with the sense component 130-*a*).

In some examples, when the switching component 275 is activated, the amplifier component 280 may be isolated from one or both of the digit line 210 or the signal line 260 (e.g., by another switching component, not shown). When the switching component 275 is deactivated, the digit line 210 may be coupled with the signal line via the amplifier component 280. In other examples, a selection component may be used to couple the memory cell 105-*a* with one of the amplifier component 280 or the bypass line 270. Additionally or alternatively, in some examples, a selection component may be used to couple the sense component 130-*a* with one of the amplifier component 280 or the bypass line 270. In some examples, a selectable bypass line 270 may support generating a sense signal for detecting a logic state of the memory cell 105-*a* by using the amplifier component 280, and generating a write signal to write a logic state to the memory cell 105-*a* that bypasses the amplifier component 280.

Some examples of a memory device that supports self-referencing read operations may share a common access line (not shown) between a memory cell 105 and a sense component 130 to support generating a sense signal and a reference signal from the same memory cell 105. In one example, a common access line between an amplifier component 280 and a sense component 130 may be referred to as an "AMPCAP line" or an "AMPCAP node," and the common access line may take the place of the signal line 260 and the reference line 265 illustrated in circuit 200. In such examples the common access line may be connected to a sense component 130 at two different nodes (e.g., a first node 131-*a* and a second node 132-*a*, as described herein).

In some examples, a common access line may permit a self-referencing read operation to share, in both a signal generating operation and a reference generating operation, component variations that may exist between the sense component 130-*a* and a memory cell 105 being accessed. Such an approach may reduce the sensitivity of the sense component 130-*a* to operational variations of various components in a memory device, such as memory cells 105, access lines (e.g., a word line 205, a digit line 210, a plate line 215), amplifiers (e.g., amplifier component 280), transistors, voltage sources 250, and others.

Although the digit line 210 and the signal line 260 are identified as separate lines, the digit line 210, the signal line 260, and any other lines or nodes between a memory cell 105 and a sense component 130 may be referred to as a single access line in accordance with examples as disclosed herein. Constituent portions of such an access line may be identified separately for the purposes of illustrating intervening components and intervening signals in various example configurations.

The sense component 130-*a* may include various transistors or amplifiers to detect and amplify a difference in signals, which may be referred to as latching. For example, the sense component 130-*a* may include a sense amplifier that receives and compares a sense signal voltage at the first node 131-*a* with a reference signal voltage at the second node 132-*a*. An output of the sense amplifier may be driven to a higher (e.g., a positive) or a lower voltage (e.g., a negative voltage, a ground voltage) based on the comparison at the sense amplifier.

For example, if the first node 131-*a* has a lower voltage than the second node 132-*a*, the output of the sense component 130-*a* may be driven by the sense amplifier to a relatively lower voltage of a first sense component voltage source 250-*b* (e.g., a voltage of $V_L$, which may be a ground voltage substantially equal to $V_0$ or a negative voltage). The sense component 130-*a* may latch the output of the sense amplifier to determine the logic state stored in the memory cell 105-*a* (e.g., detecting a logic 0 when the first node 131-*a* has a lower voltage than the second node 132-*a*).

If the first node 131-*a* has a higher voltage than the second node 132-*a*, the output of the sense component 130-*a* may be driven to the voltage of a second sense component voltage source 250-*c* (e.g., a voltage of $V_H$). The sense component 130-*a* may latch the output of the sense amplifier to determine the logic state stored in the memory cell 105-*a* (e.g., detecting a logic 1 when the first node 131-*a* has a higher voltage than the second node 132-*a*). The latched output of the sense component 130-*a*, corresponding to the detected logic state of memory cell 105-*a*, may then be output via one or more input/output (I/O) lines (e.g., I/O line 290), which may include an output through a column decoder 135, an input/output component 140, or a memory controller 150 described with reference to FIG. 1.

To perform a write operation on the memory cell 105-*a*, a voltage may be applied across the capacitor 220. Various methods may be used. In one example, the cell selection component 230 may be activated through the word line 205 to electrically connect the capacitor 220 to the digit line 210. A voltage may be applied across capacitor 220 by controlling the voltage of cell plate 221 (e.g., through plate line 215) and cell bottom 222 (e.g., through digit line 210).

For example, to write a logic 0, cell plate 221 may be taken high (e.g., applying a positive voltage to plate line 215), and cell bottom 222 may be taken low (e.g., grounding digit line 210, virtually grounding digit line 210, applying a negative voltage to digit line 210). The opposite process may be performed to write a logic 1, where cell plate 221 is taken low and cell bottom 222 is taken high. In some cases, the voltage applied across the capacitor 220 during a write operation may have a magnitude equal to or greater than a saturation voltage of a ferroelectric material in the capacitor 220, such that the capacitor 220 is polarized, and thus maintains a charge even when the magnitude of applied voltage is reduced, or if a zero net voltage is applied across the capacitor 220. In some examples, the sense component 130-*a* may be used to perform the write operations, which may include coupling the first sense component voltage source 250-*b* or the second sense component voltage source 250-*c* with the digit line. When the sense component 130-*a* is used to perform the write operations, the amplifier component 280 may or may not be bypassed (e.g., by applying a write signal via the bypass line 270).

The circuit 200, including the sense component 130-*a*, the cell selection component 230, or the amplifier component 280, may include various types of transistors. For example, the circuit 200 may include n-type transistors, where applying a relative positive voltage to the gate of the n-type transistor that is above a threshold voltage for the n-type transistor (e.g., an applied voltage having a positive magnitude, relative to a source terminal, that is greater than a threshold voltage) enables a conductive path between the other terminals of the n-type transistor (e.g., the source terminal and a drain terminal).

In some examples, the n-type transistor may act as a switching component, where the applied voltage is a logical signal that is used to enable conductivity through the transistor by applying a relatively high logical signal voltage (e.g., a voltage corresponding to a logic 1 state, which may be associated with a positive logical signal voltage supply), or to disable conductivity through the transistor by applying a relatively low logical signal voltage (e.g., a voltage corresponding to a logic 0 state, which may be associated with a ground or virtual ground voltage). In various examples where a n-type transistor is employed as a switching component, the voltage of a logical signal applied to the gate terminal may be selected to operate the transistor at a particular working point (e.g., in a saturation region or in an active region).

In some examples, the behavior of a n-type transistor may be more complex than a logical switching, and selective conductivity across the transistor may also be a function of varying source and drain voltages. For example, the applied voltage at the gate terminal may have a particular voltage level (e.g., a clamping voltage) that is used to enable conductivity between the source terminal and the drain terminal when the source terminal voltage is below a certain level (e.g., below the gate terminal voltage minus the threshold voltage). When the voltage of the source terminal voltage or drain terminal voltage rises above the certain level, the n-type transistor may be deactivated such that the conductive path between the source terminal and drain terminal is opened.

Additionally or alternatively, the circuit 200 may include p-type transistors, where applying a relative negative voltage to the gate of the p-type transistor that is above a threshold voltage for the p-type transistor (e.g., an applied voltage having a negative magnitude, relative to a source terminal, that is greater than a threshold voltage) enables a conductive path between the other terminals of the p-type transistor (e.g., the source terminal and a drain terminal).

In some examples, the p-type transistor may act as a switching component, where the applied voltage is a logical signal that is used to enable conductivity by applying a relatively low logical signal voltage (e.g., a voltage corresponding to a logical "1" state, which may be associated with a negative logical signal voltage supply), or to disable conductivity by applying a relatively high logical signal voltage (e.g., a voltage corresponding to a logical "0" state, which may be associated with a ground or virtual ground voltage). In various examples where an p-type transistor is employed as a switching component, the voltage of a logical signal applied to the gate terminal may be selected to operate the transistor at a particular working point (e.g., in a saturation region or in an active region).

In some examples, the behavior of a p-type transistor may be more complex than a logical switching by the gate voltage, and selective conductivity across the transistor may also be a function of varying source and drain voltages. For example, the applied voltage at the gate terminal may have a particular voltage level that is used to enable conductivity between the source terminal and the drain terminal so long as the source terminal voltage is above a certain level (e.g., above the gate terminal voltage plus the threshold voltage). When the voltage of the source terminal voltage falls below the certain level, the p-type transistor may be deactivated such that the conductive path between the source terminal and drain terminal is opened.

A transistor of the circuit 200 may be a field-effect transistor (FET), including a metal oxide semiconductor FET, which may be referred to as a MOSFET. These, and other types of transistors may be formed by doped regions of material on a substrate. In various examples the transistor(s) may be formed on a substrate that is dedicated to a particular component of the circuit 200 (e.g., a substrate for the sense component 130-*a*, a substrate for the amplifier component 280, a substrate for the memory cell 105-*a*), or the transistor(s) may be formed on a substrate that is common for particular components of the circuit 200 (e.g., a substrate that is common for the sense component 130-*a*, the amplifier component 280, and the memory cell 105-*a*). Some FETs may have a metal portion including aluminum or other metal, but some FETs may implement other non-metal materials such as polycrystalline silicon, including those FETs that may be referred to as a MOSFET. Further, although an oxide portion may be used as a dielectric portion of a FET, other non-oxide materials may be used in a dielectric material in a FET, including those FETs that may be referred to as a MOSFET.

In various examples in accordance with the present disclosure, the amplifier component 280 may include a differential amplifier having two input nodes (e.g., two input terminals) and an output node (e.g., an output terminal). A first of the input nodes may be configured to be coupled with the memory cell 105-*a* (e.g., via the digit line 210) and the output node may be configured to be coupled with the first node 131-*a* of the sense component 130-*a* (e.g., via the signal line 260). In some examples, the differential amplifier may be configured such that a current at the output node is proportional to a difference in voltage between the two input nodes of the differential amplifier. In various examples, the amplifier component 280 may be coupled with or between the memory cell 105-*a* and the sense component 130-*a*, or the amplifier component 280 may be a portion of the sense component 130-*a*, which may or may not be electrically equivalent.

The amplifier component 280 may also include a capacitor having two nodes (e.g., nodes associated with opposite plates of the capacitor, nodes on the opposite side of a capacitance of the capacitor), where a first node of the capacitor is coupled with the first input node. In some examples, the amplifier component 280 may include a switching component configured to selectively couple or decouple a second node of the capacitor with the output node of the differential amplifier.

Additionally or alternatively, the amplifier component 280 may include a selection component configured to selectively couple a second node of the capacitor with one of the output node of the differential amplifier or a precharge voltage source. In other words, the amplifier component 280 may include a capacitive feedback line between the output node of the differential amplifier and the first input node of the differential amplifier, and the capacitive feedback line may be selectively enabled or disabled by way of a switching component or a selection component. A switching component or a selection component may also support charging the capacitor (e.g., precharging the capacitor) prior to coupling the amplifier component 280 for developing a sensing signal to determine a logic state stored by a memory cell 105-*a*.

In some examples, the amplifier component 280 may also include a switching component configured to selectively couple the output node with the first input node. In other words, the amplifier component 280 may include a direct feedback line between the output node of the differential amplifier and the first input node of the differential amplifier, and the direct feedback line may be enabled or disabled by way of the first switching component.

By including the amplifier component 280, the memory device 100 may support particular techniques for sensing a logic state stored by the memory cell 105-*a*. For example, a method of sensing a logic state may include precharging the described capacitor of the amplifier component 280 (e.g., while a first node of the capacitor is coupled with a first input node of the differential amplifier), and coupling a second node of the capacitor with the output node of the differential amplifier after precharging the capacitor. The method may also include coupling the cell bottom 222 of the memory cell 105-*a* (e.g., via digit line 210) with the first input node of the differential amplifier while the cell plate 221 of the memory cell 105-*a* biased with a first voltage (e.g., a first plate voltage). The cell plate 221 of the memory cell 105-*a* may then be biased with a second voltage (e.g., a second plate voltage) to compensate for a non-switching state of the memory cell 105-*a*. While the cell plate 221 of the memory cell 105-*a* is biased with the second voltage, the output of the differential amplifier may be coupled with the sense component 130-*a* (e.g., with the first node 131-*a*, via the signal line 260), and the differential amplifier may provide a sense signal to the sense component 130-*a* that is based on the logic state stored by the memory cell 105-*a*. A logic state stored by the memory cell 105-*a* may be determined based at least in part on the generated sense signal. By compensating for (e.g., reducing, eliminating) a non-switching state of the memory cell 105-*a* during read operations, read margins may be improved in comparison to memory devices that do not employ such techniques for non-switching state compensation.

FIG. 3 illustrates an example of non-linear electrical properties with hysteresis plots 300-*a* and 300-*b* for a memory cell 105 that supports differential amplifier sensing schemes for non-switching state compensation in accordance with examples as disclosed herein. The hysteresis plots 300-*a* and 300-*b* may illustrate an example writing process and reading process, respectively, for a memory cell 105 employing a ferroelectric capacitor 220 as described with reference to FIG. 2. The hysteresis plots 300-*a* and 300-*b* depict the charge, Q, stored on the ferroelectric capacitor 220 as a function of a voltage difference $V_{cap}$, between the terminals of the ferroelectric capacitor 220 (e.g., when charge is permitted to flow into or out of the ferroelectric capacitor 220 according to the voltage difference $V_{cap}$). For example, the voltage difference $V_{cap}$ may represent the difference in voltage between a digit line side of the capacitor 220 and a plate line side of the capacitor 220 (e.g., $V_{bottom} - V_{plate}$).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 220 described herein may include these or other ferroelectric materials. Electric polarization within a ferroelectric capacitor 220 results in a net charge at the surface of the ferroelectric material, and attracts opposite charge through the terminals of the ferroelectric capacitor 220. Thus, charge may be stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors without ferroelectric properties such as those used in some DRAM arrays. Employing ferroelectric materials may reduce a need to perform refresh operations for some DRAM architectures, such that maintaining logic states of an FeRAM architecture may be associated with lower power consumption than maintaining logic states of a DRAM architecture.

The hysteresis plots 300-*a* and 300-*b* may be understood from the perspective of a single terminal of a ferroelectric capacitor 220. By way of example, if the ferroelectric material has a negative polarization, positive charge accumulates at the associated terminal of the ferroelectric capacitor 220. Likewise, if the ferroelectric material has a positive polarization, a negative charge accumulates at the associated terminal of the ferroelectric capacitor 220. Additionally, it should be understood that the voltages in the hysteresis plots 300-*a* and 300-*b* represent a voltage difference across the capacitor (e.g., an electric potential between the terminals of the ferroelectric capacitor 220) and are directional. For example, a positive voltage may be realized by applying a positive voltage to the perspective terminal (e.g., a cell bottom 222) and maintaining the reference terminal (e.g., a cell plate 221) at ground or virtual ground (or approximately zero volts (0V)). In some examples, a negative voltage may be applied by maintaining the perspective terminal at ground and applying a positive voltage to the reference terminal (e.g., cell plate 221). In other words, positive voltages may be applied to arrive at a negative voltage difference $V_{cap}$ across the ferroelectric capacitor 220. Similarly, two positive voltages, two negative voltages, or any combination of positive and negative voltages may be applied to the appropriate capacitor terminals to generate the voltage difference $V_{cap}$ shown in the hysteresis plots 300-*a* and 300-*b*.

As depicted in the hysteresis plot 300-*a*, a ferroelectric material used in a ferroelectric capacitor 220 may maintain a positive or negative polarization when there is no net voltage difference between the terminals of the ferroelectric capacitor 220. For example, the hysteresis plot 300-*a* illustrates two possible polarization states, a charge state 305-*a* and a charge state 310-*a*, which may represent a positively saturated polarization state and a negatively saturated polarization state, respectively. The charge states 305-*a* and 310-*a* may be at a physical condition illustrating remnant polarization (Pr) values, which may refer to the polarization (or charge) that remains upon removing the external bias (e.g., voltage). According to the example of the hysteresis plot 300-a, the charge state 305-a may represent a logic 1 when no voltage difference is applied across the ferroelectric capacitor 220, and the charge state 310-a may represent a logic 0 when no voltage difference is applied across the ferroelectric capacitor 220. In some examples, the logic values of the respective charge states may be reversed to accommodate other schemes for operating a memory cell 105.

A logic 0 or 1 may be written to the memory cell by controlling the electric polarization of the ferroelectric material, and thus the charge on the capacitor terminals, by applying a net voltage difference across the ferroelectric capacitor 220. For example, the voltage 315 may be a voltage equal to or greater than a positive saturation voltage, and applying the voltage 315 across the ferroelectric capacitor 220 may result in charge accumulation until the charge state 305-b is reached (e.g., writing a logic 1). Upon removing the voltage 315 from the ferroelectric capacitor 220 (e.g., applying a zero net voltage across the terminals of the ferroelectric capacitor 220), the charge state of the ferroelectric capacitor 220 may follow the path 320 shown between the charge state 305-b and the charge state 305-a at zero voltage across the capacitor. In other words, charge state 305-a may represent a logic 1 state at an equalized voltage across a ferroelectric capacitor 220 that has been positively saturated.

Similarly, voltage 325 may be a voltage equal to or lesser than a negative saturation voltage, and applying the voltage 325 across the ferroelectric capacitor 220 results in charge accumulation until the charge state 310-b is reached (e.g., writing a logic 0). Upon removing the voltage 325 from the ferroelectric capacitor 220 (e.g., applying a zero net voltage across the terminals of the ferroelectric capacitor 220), the charge state of the ferroelectric capacitor 220 may follow the path 330 shown between the charge state 310-b and the charge state 310-a at zero voltage across the capacitor. In other words, charge state 310-a may represent a logic 0 state at an equalized voltage across a ferroelectric capacitor 220 that has been negatively saturated. In some examples, the voltage 315 and the voltage 325, representing saturation voltages, may have the same magnitude, but opposite polarity across the ferroelectric capacitor 220.

To read, or sense, the stored state of a ferroelectric capacitor 220, a voltage may also be applied across the ferroelectric capacitor 220. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-a or the charge state 310-a, or some other charge state was initially stored, among other factors.

The hysteresis plot 300-b illustrates an example of access operations for reading of stored charge states 305-a and 310-a. A read voltage 335 may be applied, for example, as a voltage difference via a digit line 210 and a plate line 215 as described with reference to FIG. 2. The hysteresis plot 300-b may illustrate read operations where the read voltage 335 is a negative voltage difference $V_{cap}$ (e.g., where $V_{bottom}-V_{plate}$ is negative). A negative read voltage across the capacitor may be referred to as a "plate high" read operation, where a plate line 215 is taken initially to a high voltage, and a digit line 210 is initially at a low voltage (e.g., a ground voltage). Although the read voltage 335 is shown as a negative voltage across the ferroelectric capacitor 220, in alternative operations a read voltage may be a positive voltage across the ferroelectric capacitor 220, which may be referred to as a "plate low" read operation.

The read voltage 335 may be applied across the ferroelectric capacitor 220 while a memory cell 105 is selected (e.g., by activating a cell selection component 230 via a word line 205 as described with reference to FIG. 2). Upon applying the read voltage 335 to the ferroelectric capacitor 220, charge may flow into or out of the ferroelectric capacitor 220 via the associated digit line 210 and plate line 215, and, in some examples, different charge states or access line voltages may result depending on whether the ferroelectric capacitor 220 was at the charge state 305-a (e.g., a logic 1) or at the charge state 310-a (e.g., a logic 0), or some other charge state.

When performing a read operation on a ferroelectric capacitor 220 at the charge state 310-a (e.g., a logic 0), additional negative charge may accumulate across the ferroelectric capacitor 220, and the charge state may follow path 340 until reaching the charge and voltage of the charge state 310-c. The amount of charge flowing through the capacitor 220 may be related to the intrinsic or other capacitance of the digit line 210 (e.g., intrinsic capacitance 240 described with reference to FIG. 2). In a "plate high" read configuration, a read operation associated with the charge states 310-a and 310-c, or more generally a read operation associated with the logic 0 state, may be associated with a relatively small amount of charge transfer (e.g., compared to a read operation associated with the charge states 305-a and 305-c, or more generally the logic 1 state).

As shown by the transition between the charge state 310-a and the charge state 310-c, the resulting voltage 350 across the ferroelectric capacitor 220 may be a relatively large negative value due to the relatively large change in voltage for the given change in charge. Thus, upon reading a logic 0 in a "plate high" read operation, the digit line voltage, equal to the sum of $V_{PL}$ and the value of $(V_{bottom}-V_{plate})$ at the charge state 310-c, may be a relatively low voltage. Such a read operation may not change the remnant polarization of the ferroelectric capacitor 220 that stored the charge state 310-a, and thus after performing the read operation the ferroelectric capacitor 220 may return to the charge state 310-a via path 340 when the read voltage 335 is removed (e.g., by applying a zero net voltage across the ferroelectric capacitor 220, by equalizing the voltage across the ferroelectric capacitor 220). Thus, performing a read operation with a negative read voltage on a ferroelectric capacitor 220 with a charge state 310-a may be considered a non-destructive read process.

When performing the read operation on the feroelectric capacitor 220 at the charge state 305-a (e.g., a logic 1), the stored charge may reverse polarity as a net negative charge accumulates across the ferroelectric capacitor 220, and the charge state may follow the path 360 until reaching the charge and voltage of the charge state 305-c. The amount of charge flowing through the capacitor 220 may again be related to the intrinsic or other capacitance of the digit line 210 (e.g., intrinsic capacitance 240 described with reference to FIG. 2). In a "plate high" read configuration, a read operation associated with the charge states 305-a and 305-c, or more generally a read operation associated with the logic 1 state, may be associated with a relatively large amount of charge transfer (e.g., compared to a read operation associated with the charge states 310-a and 310-c, or more generally the logic 0 state).

As shown by the transition between the charge state 305-*a* and the charge state 305-*c*, the resulting voltage 355 may, in some cases, be a relatively small negative value due to the relatively small change in voltage at the capacitor 220 for the given change in charge. Thus, upon reading a logic 1 in a "plate high" read operation, the digit line voltage, equal to the sum of $V_{PL}$ and $V_{cap}$ (e.g., $V_{bottom}-V_{plate}$) at the charge state 310-*c*, may be a relatively high voltage.

The transition from the charge state 305-*a* to the charge state 305-*d* may be illustrative of a sensing operation that is associated with a partial reduction or partial reversal in polarization or charge of a ferroelectric capacitor 220 of a memory cell 105 (e.g., a reduction in the magnitude of charge Q from the charge state 305-*a* to the charge state 305-*d*). In other words, according to the properties of the ferroelectric material, after performing the read operation the ferroelectric capacitor 220 may not return to the charge state 305-*a* when the read voltage 335 is removed (e.g., by applying a zero net voltage across the ferroelectric capacitor 220, by equalizing the voltage across the ferroelectric capacitor 220). Rather, when applying a zero net voltage across the ferroelectric capacitor 220 after a read operation of the charge state 305-*a* with read voltage 335, the charge state may follow path 365 from the charge state 305-*c* to the charge state 305-*d*, illustrating a net reduction in polarization magnitude (e.g., a less positively polarized charge state than initial charge state 305-*a*, illustrated by the difference in charge between the charge state 305-*a* and the charge state 305-*d*). Thus, performing a read operation with a positive read voltage on a ferroelectric capacitor 220 with a charge state 305-*a* may be described as a destructive read process. However, in some sensing schemes, a reduced remnant polarization may still be read as the same stored logic state as a saturated remnant polarization state (e.g., supporting detection of a logic 1 from both the charge state 305-*a* and the charge state 305-*d*), thereby providing a degree of non-volatility for a memory cell 105 with respect to read operations.

The position of the charge state 305-*c* and the charge state 310-*c* after initiating a read operation may depend on a number of factors, including the specific sensing scheme and circuitry. In some cases, the final charge may depend on the net capacitance of the digit line 210 coupled with the memory cell 105, which may include an intrinsic capacitance 240, integrator capacitors, reference capacitors, and others. For example, if a ferroelectric capacitor 220 is electrically coupled with digit line 210 at 0V and the read voltage 335 is applied to the plate line, the voltage of the digit line 210 may rise when the memory cell 105 is selected due to charge flowing from the ferroelectric capacitor 220 to the net capacitance of the digit line 210. Thus, a voltage measured at a sense component 130 may not be equal to the read voltage 335, or the resulting voltages 350 or 355, and instead may depend on the voltage of the digit line 210 following a period of charge sharing.

The position of the charge state 305-*c* and the charge state 310-*c* on hysteresis plot 300-*b* upon initiating a read operation may depend on the net capacitance of the digit line 210 and may be determined through a load-line analysis. In other words, the charge states 305-*c* and 310-*c* may be defined with respect to the net capacitance of the digit line 210, or other access line (e.g., a signal line 260). As a result, the voltage of the ferroelectric capacitor 220 after initiating a read operation (e.g., voltage 350 when reading the ferroelectric capacitor 220 that stored the charge state 310-*a*, voltage 355 when reading the ferroelectric capacitor 220 that stored the charge state 305-*a*), may be different and may depend on the initial state of the ferroelectric capacitor 220. In some examples, the amount of change in polarization of a ferroelectric capacitor 220 of a memory cell 105, for instance as a result of a sensing operation, may be selected according to a particular sensing scheme.

The initial state of the ferroelectric capacitor 220 may be determined by comparing the voltage of a digit line 210 (or signal line 260, where applicable) resulting from the read operation with a reference voltage (e.g., via a reference line 265 as described with reference to FIG. 2, or via a common access line). In some examples, the digit line voltage may be the sum of the plate line voltage and the final voltage across the ferroelectric capacitor 220 (e.g., voltage 350 when reading the ferroelectric capacitor 220 having a stored the charge state 310-*a*, or voltage 355 when reading the ferroelectric capacitor 220 having a stored the charge state 305-*a*). In some examples, the digit line voltage may be the difference between the read voltage 335 and the final voltage across the capacitor 220 (e.g., (read voltage 335–voltage 350) when reading the ferroelectric capacitor 220 having a stored the charge state 310-*a*, (read voltage 335–voltage 355) when reading the ferroelectric capacitor 220 having a stored the charge state 305-*a*).

In some examples, one or more read operations of a memory cell 105 may be associated with a voltage (e.g., a fixed voltage) of a digit line 210, where a charge state of a ferroelectric capacitor 220 after initiating a read operation may be the same regardless of its initial charge state. For example, during a read operation where a digit line 210 is held at a fixed read voltage 335, the ferroelectric capacitor 220 may move to a charge state 370 for the case where the ferroelectric capacitor initially stored a charge state 305-*a* and for the case where the ferroelectric capacitor initially stored a charge state 310-*a*. In some examples, the charge state 370 may be illustrative of a saturated charge state or a saturation voltage (e.g., a saturating read voltage), which may be a same charge state or a different charge state as charge state 310-*b* described with reference to hysteresis plot 300-*a* (e.g., where the read voltage 335 may equal to, or different than, the voltage 325). For example, the read voltage 335 may be a same voltage as used to write a logic state to a memory cell 105 (e.g., a logic 0).

Thus, in some examples, rather than using a change in voltage of a digit line 210 to detect an initial charge state or logic state, the initial charge state or logic state of the ferroelectric capacitor 220 may be determined based at least in part on the difference in charge (e.g., charge transfer with a memory cell 105) associated with the read operation. For example, as illustrated by hysteresis plot 300-*b*, a logic 1 may be detected based on difference in charge, Q, between charge state 305-*a* and charge state 370 (e.g., a relatively large amount of charge transfer), and a logic 0 may be detected based on a difference in charge, Q, between charge state 310-*a* and charge state 370 (e.g., a relatively small amount of charge transfer).

In some examples, such a detection may be supported by a charge-transfer sensing amplifier, a cascode (e.g., a transistor configured in a cascode arrangement), a transconductance or other differential amplifier, or other signal development circuitry between a digit line 210 and a signal line 260, where a voltage of the signal line 260 may be based at least in part on the amount of charge transfer of a capacitor 220 after initiating a read operation (e.g., where the described charge transfer may correspond to an amount of charge that passes through the charge-transfer sensing amplifier, cascode, or other signal development circuitry). In such examples, the voltage of the signal line 260 may be compared with a reference voltage (e.g., at a sense component 130) to determine the logic state initially stored by the ferroelectric capacitor 220, despite the digit line 210 being held at a fixed voltage level. In some examples, a digit line 210 may be used to provide a reference voltage (e.g., in a configuration where a reference line 265 is configured to be coupled with the digit line 210).

In examples where a digit line 210 is held at a first voltage, such as a fixed read voltage 335, a capacitor 220 may be negatively saturated after a read operation irrespective of whether the capacitor 220 was initially at a charge state 305-a (e.g., a logic 1) or initially at a charge state 310-a (e.g., a logic 0). Accordingly, after such a read operation, the capacitor 220 may, at least temporarily, be charged according to a logic 0 state irrespective of its initial or intended logic state. Thus, a rewrite operation may be required at least when the capacitor 220 is intended to store a logic 1 state, where such a rewrite operation may include applying a write voltage 315 to store a logic 1 state as described with reference to hysteresis plot 300-a. Such a rewrite operation may be configured or otherwise described as a selective rewrite operation because a rewrite voltage may not need to be applied when the capacitor 220 is intended to store a logic 0 state. In some examples, such an access scheme may be referred to as a "2Pr" scheme, where the difference in charge transfer for distinguishing a logic 0 from a logic 1 may be equal to two times the remnant polarization of a memory cell 105 (e.g., a difference in charge between charge state 305-a, a positively saturated charge state, and charge state 310-a, a negatively saturated charge state).

In some sensing schemes, a reference voltage may be generated such that the reference voltage is between the possible voltages (e.g., of a digit line 210, of a signal line 260) that may result from reading different logic states. For example, a reference voltage may be selected to be lower than the resulting digit line voltage when reading a logic 1, and higher than the resulting digit line voltage when reading a logic 0. In other examples a comparison may be made at a portion of a sense component 130 that is different from a portion where a digit line is coupled, and therefore a reference voltage may be selected to be lower than the resulting voltage at the comparison portion of the sense component 130 when reading a logic 1, and higher than the resulting voltage at the comparison portion of the sense component 130 when reading a logic 0. During comparison by the sense component 130, the voltage based on the sensing may be determined to be higher or lower than the reference voltage, and the stored logic state of the memory cell 105 (e.g., a logic 0, a logic 1) may thus be determined.

During a sensing operation, the resulting sense signals from reading various memory cells 105 may be a function of manufacturing or operational variations between the various memory cells 105. For example, although the charge state 370, or a slope between the charge state 310-a and the charge state 370, may be illustrative of reading one memory cell 105, reading another memory cell 105 may be associated with a different amount of charge associated with an applied read voltage 335 (e.g., a charge state that is higher or lower in charge than the charge state 370 illustrated in the hysteresis plot 300-b), or a different slope of charge versus voltage when a read voltage 335 is removed (e.g., when the memory cell 105 is equalized), or both. In various examples, such a difference may be described as a difference in a recoil characteristics between memory cells 105, or a difference in a displacement components between memory cells 105, among other examples.

In some examples, a difference in recoil characteristics or a displacement component may be related to capacitors of various memory cells 105 having different capacitance levels (e.g., between the charge state 310-a and the charge state 370, in a linear capacitance region of the described hysteresis characteristics). In some examples, a recoil characteristic or a displacement component may be based at least in part on other circuitry coupled with a memory cell 105, but may be similar to the characteristics illustrated in the hysteresis plot 300-b. For example, intrinsic capacitance (e.g., intrinsic capacitance 240 described with reference to FIG. 2) may vary from one digit line 210 to the next digit line 210 in a memory device, and may also vary within a digit line 210 from the perspective of one memory cell 105 to the next memory cell 105 on the same digit line. Thus, for these and other reasons, reading a logic 1 at a read voltage 335 may be associated with different levels of charge transfer with a digit line 210 from one memory cell to the next, and reading a logic 0 at a read voltage 335 may be associated with different levels of charge transfer with a digit line 210 from one memory cell to the next, and such differences in charge transfer may be associated with unfavorable read margins.

In accordance with examples as disclosed herein, a read operation may include multiple biasing operations on a memory cell 105, which may reduce or mitigate differences in recoil characteristics or displacement components between memory cells 105. For example, a read operation may include a first biasing across a memory cell 105 at the read voltage 335, followed by an equalization bias across the respective memory cell 105, which, for both a logic 0 and a logic 1, may have a final charge (e.g., of the read operation) related to charge state 310-a. A sense signal generated for a logic 1 may be based on a charge transfer with a digit line 210 related to a difference in charge between charge state 305-a and charge state 310-a, and a sense signal generated for a logic 0 may be based on approximately zero charge transfer (e.g., when transitioning from a charge state 310-a to the charge state 370, and back to the charge state 310-a, which may be referred to as a non-switching state), or some amount (e.g., a minimal amount) of charge transfer related to charge leakage or other disturbance of a memory cell 105 originally written with the charge state 310-a (e.g., a disturbance related to an equalized charge state before the read operation having a charge, Q, with a lower magnitude than the charge state 310-a).

Thus, by applying multiple biasing operations on a given memory cell 105 during a read operation (e.g., multiple biases associated with multiple charge sharing phases of a read operation, multiple biases associated different directions of charge sharing with a memory cell 105), the charge state 370, and any associated variabilities, may be canceled out of the sense signal generation (e.g., being omitted from sense signal generation for both reading a logic 1 and reading a logic 0), rather than detecting a logic 1 based on a difference between the charge state 370 and the charge state 305-a, and detecting a logic 0 based on a difference between the charge state 370 and the charge state 310-a, as may be the case in other techniques. Such a cancelation or omission of the charge state 370 from a generated sense signal may be referred to as non-switching state compensation, and may improve read margins compared with read operations that generate a sense signal at a charge state 370 by eliminating or reducing a source of variability between read operations.

Figure 4:
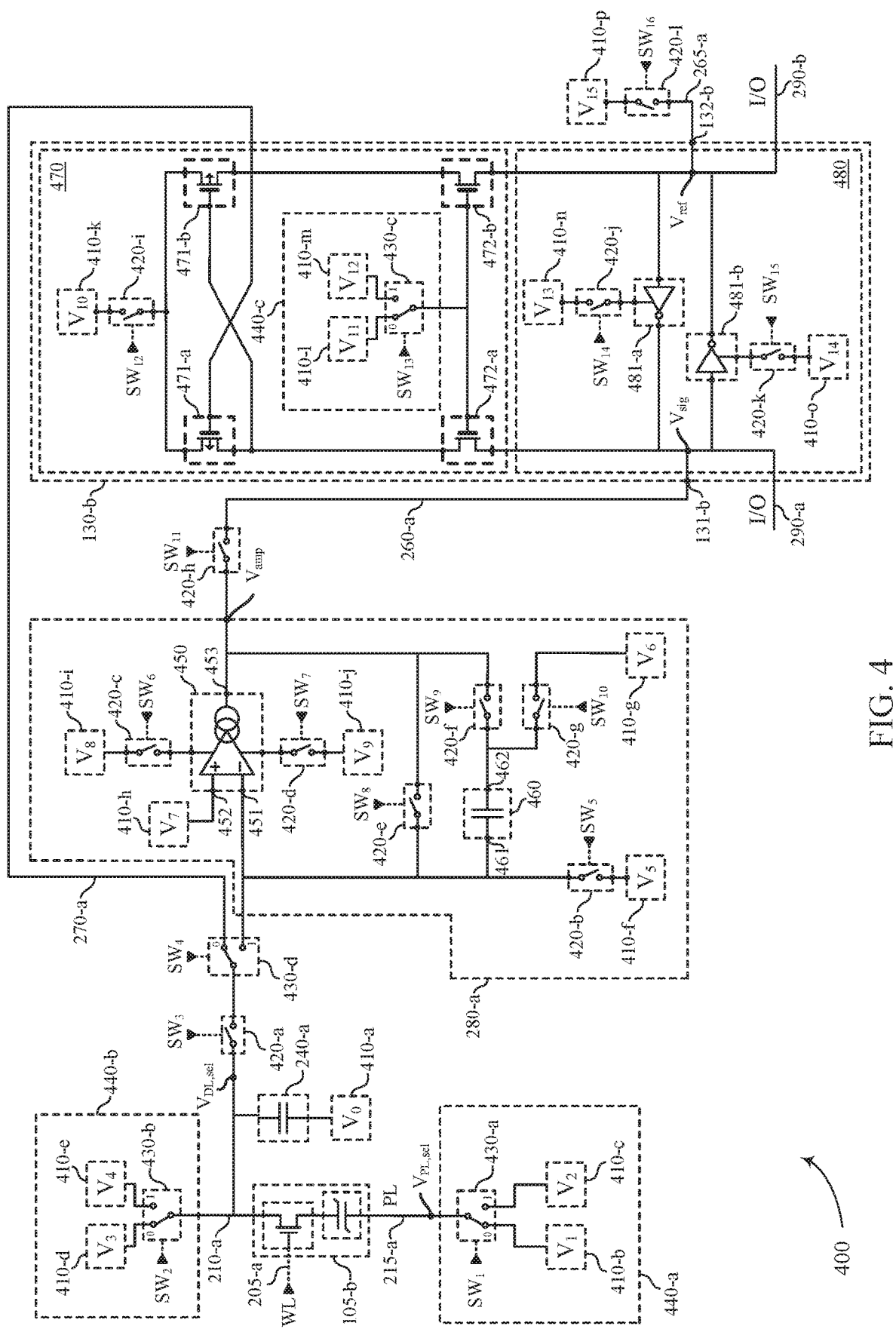
FIG. 4 illustrates an example of a circuit that supports differential amplifier sensing schemes for non-switching state compensation in accordance with examples as disclosed herein.

FIG. 4 illustrates an example of a circuit 400 that supports differential amplifier sensing schemes for non-switching state compensation in a memory device in accordance with examples as disclosed herein. The circuit 400 may include a memory cell 105-b and a sense component 130-b for sensing a logic state of the memory cell 105-b. The memory cell 105-b and the sense component 130-b may be examples of the respective components described with reference to FIGS. 1 and 2.

The circuit 400 may include a word line 205-a, a digit line 210-a, and a plate line 215-a. Each of the word line 205-a, the digit line 210-a, and the plate line 215-a may be coupled with one or more memory cells 105, including the memory cell 105-b as shown. In some examples, the circuit 400 may be included in a memory array where each of a plurality of plate lines 215 (e.g., independently-addressable plate lines 215) correspond to a respective one of a plurality of digit lines 210, such as the configuration of the memory device 100 illustrated by FIG. 1. Alternatively, in some examples, the circuit 400 may be included in a memory array where the plate line 215-a is illustrative of a common plate or common plate node. The digit line 210-a and the plate line 215-a may be associated with voltages $V_{DL,sel}$ and $V_{PL,sel}$, respectively, as shown. In some examples, other digit lines 210 in the memory array may be associated with a voltage $V_{DL,unsel}$, and other plate lines 215 in the memory array may be associated with a voltage $V_{PL,unsel}$. When digit lines 210 in the memory array are commonly biased, they may be associated with a common voltage $V_{DL}$, and when plate lines 215 in the memory array are commonly biased, or when the plate line 215-a corresponds to a common plate, a biasing may be associated with a common voltage $V_{PL}$.

In some examples, the digit line 210-a may be associated with an intrinsic capacitance, which may illustrated by intrinsic capacitance 240-a. The circuit 400 may include a signal line 260-a coupled with the sense component 130-b at a first node 131-b, and a reference line 265-a coupled with the sense component 130-b at a second node 132-b. The circuit 400 may include a first I/O line 290-a and a second I/O line 290-b. In some examples, the circuit 400 may also include a bypass line 270-a (e.g., as illustrated between the sense component 130-b and the memory cell 105-b), which may permit certain signals between the sense component 130-b and the memory cell 105-b (e.g., write signals) to bypass the amplifier component 280-a. Each of these illustrated components may be examples of the respective components described with reference to FIG. 2

The circuit 400 may include the word line 205-a for selecting or deselecting the memory cell 105-b (e.g., by way of logic signal WL). The circuit 400 may include the plate line 215-a for accessing a cell plate of a capacitor of the memory cell 105-b. Tus, the memory cell 105-b may represent a memory cell coupled with or between a first access line (e.g., the digit line 210-a, the signal line 260-a) and a second access line (e.g., the word line 205-a). Electrical signals may be communicated between the sense component 130-b and an input/output component 140 (not shown) via input/output lines 290-a and 290-b, where signals of the input/output lines 290-a and 290-b may be illustrated by the voltages $V_{sig}$ and $V_rf$, respectively. In other words, as illustrated, the sense component 130-b may be coupled with the memory cell 105-b and coupled with an input/output component 140.

The circuit 400 may include an amplifier component 280-a, which may be an example of the amplifier component 280 described with reference to FIG. 2. In the example of circuit 400, the amplifier component 280-a may include a differential amplifier 450, which may have a first input node 451, a second input node 452, and an output node 453. An output voltage of the amplifier component 280-a (e.g., an output voltage of the differential amplifier 450) may be illustrated by a voltage $V_{amp}$ at an output node of the amplifier component 280-a. In some examples, the amplifier component 280-a may be in electronic communication with a memory controller (not shown), such as a memory controller 150 described with reference to FIG. 1, which may control various operations of the amplifier component 280-a.

In some examples, the differential amplifier 450 may be configured such that a current at the output node is proportional to a difference in voltage between the two input nodes of the differential amplifier. In some cases, the configuration of the differential amplifier 450 may be referred to as a "transconductance" amplifier. For example, the first input node 451 may be considered a "negative" node and the second input node 452 may be considered a "positive" node. In some examples, the differential amplifier 450 may be configured such that the current at the output node 453 is proportional to the voltage at the second input node 452 minus the voltage at the first input node 451. However, the described techniques may leverage different amplifier configurations or architectures.

In the example of circuit 400, the amplifier component 280-a may include an integrator capacitor 460, which may have a first node 461 and a second node 462. In the example of circuit 400, the amplifier component 280-a may include a switching component 420-f that may be used to selectively couple or decouple the output node 453 of the differential amplifier 450 with the second node 462 of the integrator capacitor 460 (e.g., by activating or deactivating a logical signal $SW_9$). In other words, the amplifier component 280-a illustrates an example of including a differential amplifier 450 with a capacitive feedback line (e.g., via the capacitance of the integrator capacitor 460), which may be selectively enabled or disabled (e.g., by activating or deactivating the switching component 420-f). Although illustrated as a separate component of the circuit 400, the capacitor 460 may be a distributed capacitance or capacitive element or component, or may include other physical features of a device that includes the circuit 400, to provide the capacitive properties between the illustrated nodes of the circuit 400.

In the example of circuit 400, the amplifier component 280-a may include a switching component 420-e, which may be used to selectively connect or disconnect the output node 453 with the first input node 451 (e.g., by activating or deactivating a logical signal $SW_8$). In other words, the amplifier component 280-a may include a differential amplifier 450 having a direct feedback line that may be selectively enabled or disabled via the switching component 420-e. In other examples of an amplifier component 280, the switching component 420-e may be omitted. For example, when the switching component 420-e is omitted, the output node 453 of the differential amplifier 450 may be selectively coupled or decoupled with another voltage source that provides an equalization of the output node 453.

In some examples, the differential amplifier 450 may be configured such that, when the voltage at the first input node 451 is higher than the voltage at the second input node 452, current may flow into the output node 453 (e.g., into the differential amplifier low voltage source, such as into voltage source 410-j). Accordingly, the differential amplifier 450 may be capable of supporting a negative gain in the amplifier component 280-a. If the differential amplifier 450 has a gain that is greater than a threshold (e.g., and intrinsic capacitance may be negligible compared to cell capacitance and integrator capacitor capacitance), a change in output voltage at the output node 453 may relate to the following:

$$dV_{out} \approx dV_{PL,sel} \frac{C_{cell}}{C_{ampcap}} \approx -\frac{dQ_{cell}}{C_{ampcap}}$$

where $dV_{out}$ represents the change in voltage at the output node 453, $dV_{PL,sel}$ represents the change in plate line voltage $V_{PL,sel}$ upon accessing a memory cell 105, $C_{cell}$ represents the capacitance of the memory cell 105, $C_{ampcap}$ represents the capacitance of the integrator capacitor 460, and $dQ_{cell}$ represents the change in charge of a memory cell 105 upon accessing the memory cell 105.

The circuit 400 may include switching components 420 or selection components 430 to selectively couple, decouple, or bypass the amplifier component 280-a or the sense component 130-b for various access operations. For example, the circuit 400 may include a switching component 420-a to support selectively coupling or decoupling the memory cell 105-b (e.g., via the digit line 210-a) from one or both of the amplifier component 280-a or the sense component 130-b (e.g., by activating or deactivating a logical signal SW).

In some examples, the switching component 420-a associated with the memory cell 105-b may be one of a plurality of switching components 420 associated with respective ones of a plurality of memory cells 105. In such examples, the plurality of switching components 420 (e.g., including the switching component 420-a) may be referred to as a digit line multiplexer, a digit line selector, or a digit line shunt. In such examples, one of the plurality of memory cells 105 (e.g., the memory cell 105-b) may be selected, and the other of the plurality of memory cells 105 may be deselected (e.g., remaining in an "idle" state).

The circuit 400 may also include a switching component 420-h to support selectively coupling or decoupling the amplifier component 280-a with the sense component 130-b (e.g., by activating or deactivating a logical signal $SW_{11}$). Further, in the example of circuit 400, a selection component 430-d is provided, and may selectively couple the memory cell 105-b (e.g., the digit line 210-a) with one of the amplifier component 280-a or the sense component 130-b (e.g., via bypass line 270-a). In other words, when the selection component 430-d is deactivated (e.g., by deactivating a logical signal $SW_4$), signals may be shared directly between the digit line 210-a and the sense component 130-b, which may include bypassing the amplifier component 280-a. In some examples, this operational state may advantageously support certain write operations. When the selection component 430-d is activated (e.g., by activating a logical signal $SW_4$), signals may be shared between the digit line 210-a and the sense component 130-b by way of the amplifier component 280-a. In some examples, this operational state may advantageously support certain read operations. In other words, the selection component 430-d may be activated or deactivated based on whether the circuit 400 is supporting a rad operation or a write operation.

The circuit 400 may include a variety of voltage sources 410 and variable voltage sources 440, which may be coupled with various voltage supplies and/or common grounding or virtual grounding points of a memory device that may include the example circuit 400. Although variable voltage sources 440 are illustrated as including two respective voltage sources 410 and a respective selection component 430, a variable voltage source 440 supporting the operations herein may include other configurations, such as a voltage buffer or a deviator that provides an otherwise variable voltage.

A voltage source 410-a may represent a common grounding point (e.g., a chassis ground, a neutral point), which may be associated with a common reference voltage having a voltage $V_0$, from which other voltages are defined. The voltage source 410-a may be coupled with the digit line 210-a via the intrinsic capacitance 240-b of the digit line 210-a.

A variable voltage source 440-a may represent a variable plate line voltage source, and may be coupled with the memory cell 105-b via the plate line 215-a of the memory cell 105-b. In various examples, the variable voltage source 440-a may be used for access operations (e.g., read operations, write operations), including those operations described with reference to hysteresis plots 300-a and 300-b of FIG. 3. The variable voltage source 440-a may include a voltage source 410-b having a voltage $V_1$ (e.g., a voltage source having a voltage that is below a threshold, a voltage that is relatively lower than $V_2$) and a voltage source 410-c having a voltage $V_2$ (e.g., a voltage source having a voltage that is above a threshold, a voltage that is relatively higher than $V_1$), and one of the voltage source 410-b or the voltage source 410-c may be selectively coupled with the plate line 215-a via a selection component 430-a, which may be activated or deactivated by a logical signal $SW_1$. In one example, $V_1$ may be selected to be equal to 0V and $V_2$ may be selected to be equal to 1.5V.

In some examples, $V_2$ may be configured or selected for providing a plate high read bias across the memory cell 105-b (e.g., relative to the digit line voltage, $V_{DL}$), such as a read voltage 335 described with reference to FIG. 3. $V_1$ may be configured or selected for providing an equalization bias across the memory cell 105-b (e.g., relative to the digit line voltage, $V_{DL}$), such as when accompanied by a bias of the digit line 210-a at the same voltage. In accordance with examples as disclosed herein, the variable voltage source 440-a may be operable to apply different biases to a cell plate of the memory cell 105-b during sense signal generation of a read operation, which may support techniques for canceling a recoil characteristic or displacement component, or other non-switching state compensation, as described with reference to FIG. 3.

A variable voltage source 440-b may represent a variable digit line voltage source, and may be coupled with the memory cell 105-b via the digit line 210-a of the memory cell 105-b. In various examples, the variable voltage source 440-b may be used for access operations (e.g., read operations, write operations), including those operations described with reference to hysteresis plots 300-a and 300-b of FIG. 3. The variable voltage source 440-b may include a voltage source 410-d having a voltage $V_3$ (e.g., a voltage source having a voltage that is below a threshold, a voltage that is relatively lower than $V_4$) and a voltage source 410-e having a voltage $V_4$ (e.g., a voltage source having a voltage that is above a threshold, a voltage that is relatively higher than $V_3$), and one of the voltage source 410-d or the voltage source 410-e may be selectively coupled with the digit line 210-a via a selection component 430-b, which may be activated or deactivated by a logical signal $SW_2$. In one example, $V_3$ may be selected to be equal to 0V and $V_4$ may be selected to be equal to 1.5V.

Although one digit line voltage source (e.g., variable voltage source 440-b) is shown, each of the digit lines 210 in a memory device may be associated with a variable or selectable voltage. For example, when a digit line 210 for a particular memory cell is selected, the digit line 210 for that cell may be set to a "selected" cell voltage (e.g., $V_3$, in some examples) while the other digit lines that are not selected may be set to an "idle" cell voltage (e.g., $V_4$, in some examples). Such an arrangement may be provided by various configurations of voltage sources 410, switching components 420, and selection components 430, which may or may not include the use of a variable voltage source 440.

A voltage source 410-f may represent an amplifier input equalization voltage source (e.g., a chassis ground, a neutral point), and may be associated with a voltage $V_5$. In various examples, the voltage source 410-f may or may not be associated with a same reference point as the common grounding point of voltage source 410-a. The voltage source 410-f may be selectively coupled with the first input node 451 of the differential amplifier 450 via a switching component 420-b, which may be activated or deactivated by a logical signal $SW_5$. In examples where the amplifier component 280 includes the switching component 420-e, the voltage source 410-f may also support equalizing the output node 453 of a differential amplifier 450 (e.g., when the switching component 420-e is activated), and thus the voltage source 410-f may be referred to as an amplifier equalization voltage source.

A voltage source 410-g may represent an integrator capacitor precharge voltage source, and may be associated with a voltage $V_6$. The voltage source 410-g may be selectively coupled with the second node 462 of the integrator capacitor 460 via a switching component 420-g, which may be activated or deactivated by a logical signal $SW_{10}$. In one example, $V_6$ may be selected to be equal to 0.8V.

A voltage source 410-h may represent a differential amplifier reference voltage source, and may be associated with a voltage $V_7$. In the example of circuit 400 the voltage source 410-h may be coupled directly with the second input node 452 of the differential amplifier 450. In other examples, the voltage source 410-h may be selectively coupled or decoupled with the second input node 452 by a switching component 420 (not shown). In one example, the voltage $V_7$ may be approximately 0V, and may be coupled with a same voltage supply as, for example, voltage source 410-a, voltage source 410-b, voltage source 410-d, voltage source 410-f, or a combination thereof.

A voltage source 410-i may represent a differential amplifier high voltage source, and may be associated with a voltage $V_8$. The voltage source 410-i may be selectively coupled with a first supply node of the differential amplifier 450 via a switching component 420-c, which may be activated or deactivated by a logical signal $SW_6$. A voltage source 410-j may represent a differential amplifier low voltage source, and may be associated with a voltage $V_9$. The voltage source 410-j may be selectively coupled with a second supply node of the differential amplifier 450 via a switching component 420-d, which may be activated or deactivated by a logical signal $SW_7$. In one example, $V_8$ may be selected to be equal to 1.0V and $V_9$ may be selected to be equal to −0.5V. In other words, in some examples, the differential amplifier 450 may be supplied with a positive voltage and a negative voltage via the voltage sources 410-i and 410-j.

In some examples, activating $SW_6$, $SW_7$, or both may be referred to as "enabling" or "activating" the differential amplifier 450. In some examples, logical signals $SW_6$ and $SW_7$ may be provided by the same logical signal (e.g., by a memory controller), or logical signals $SW_6$ and $SW_7$ may be shared in a different manner, or logical signals $SW_6$ and $SW_7$ may otherwise be substantially the same logical signal.

A voltage source 410-p may provide a reference voltage for sensing the logic state of the memory cell 105-b, and may be associated with a voltage $V_5$. The voltage source 410-p may be selectively coupled or decoupled with the sense component 130-b via a switching component 420-l, which may be activated or deactivated by way of logical signal $SW_{16}$. In some examples, the voltage $V_{15}$ may be an average voltage between the voltage of signal line 260-a (e.g., $V_{sig}$) associated with sensing a logic 1 and a logic 0 of the memory cell 105-b. In some examples, a voltage of $V_{15}$ may be provided as a voltage dropped from a voltage supply of the memory device, which may be the same voltage supply coupled with other voltage sources 410. For example, $V_{15}$ may be provided by connecting voltage source 410-p with a same voltage supply as voltage source 410-k, voltage source 410-c, voltage source 410-e, voltage source 410-i, or voltage source 410-k, but with an intervening electrical load (e.g., a resistive load, a capacitance) between the voltage supply and the voltage source 410-p. In one example, $V_6$ may be selected to be equal to 0.2V.

The sense component 130-b may, in some examples, be used to latch signals associated with a read operation when detecting a logic state stored by a memory cell 105. Electrical signals associated with such latching may be communicated between the sense component 130-b (e.g., a sense amplifier) and an input/output component 140 (not shown), for example, via I/O lines 290-a and 290-b. In some examples, the sense component 130-b may be in electronic communication with a memory controller (not shown), such as a memory controller 150 described with reference to FIG. 1, which may control various operations of the sense component 130-b.

In some examples, the first node 131-b may be referred to as a signal node, and may be electrically equivalent to, or otherwise associated with (e.g., coupled with) the signal line 260-a. The first node 131-b may be coupled with the amplifier component 280-a (e.g., the output node 453 of the differential amplifier 450) via switching component 420-h. In other words, the switching component 420-h may illustrate a switching component 420 coupled with or between the memory cell 105-b and the first node 131-b, and configured to selectively couple the memory cell 105-b with the first node 131-b.

In some examples, the second node 132-b may be referred to as a reference node, and may be electrically equivalent to, or otherwise associated with (e.g., coupled with) the reference line 265-a. The second node 132-b may be coupled with a reference voltage source (e.g., voltage source 410-p) via a switching component 420-l. In other words, the switching component 420-l may illustrate a switching component 420 coupled with or between a reference voltage source and the second node 132-b, and configured to selectively couple the reference voltage source with the second node 132-b.

Although circuit 400 is illustrated with a separate reference voltage source, other examples or configurations that support the described differential amplifier schemes for non-switching state compensation may employ a self-referencing access scheme, where a reference voltage may be provided at least in part by accessing the memory cell 105-b. In such examples, the memory cell 105-b may be coupled with the second node 132-b, which may or may not include being coupled via the amplifier component 280-a. In other words, to support a self-referencing scheme, in some examples, the second node 132-b may be coupled with the signal line 260-a (e.g., as a "common" access line) or with the bypass line 270-a. In such examples, the switching component 420-l may be a switching component 420 coupled with or between the memory cell 105-b and the second node 132-b, and configured to selectively couple the memory cell 105-b with the second node 132-b.

In some examples, a first node 131 and a second node 132 may be located at different portions of the sense component 130-b, which may or may not be electrically equivalent to the positions of the first node 131-b and the second node 132-b illustrated in the circuit 400. For example, the first node 131-b may be located outside a sense amplifier of the sense component 130-b (e.g., electrically equivalent with such a location), and the first node 131-b may therefore be coupled with or between (e.g., be located between) a sense amplifier and the memory cell 105-b. In another example, the second node 132-b may be located outside a sense amplifier of the sense component 130-b (e.g., electrically equivalent with such a location), and the second node 132-b may therefore be coupled with or between (e.g., located between) the sense amplifier and the reference voltage source (e.g., voltage source 410-p). In an example that supports self-referencing access schemes (not shown), the second node 132-b may be located outside a sense amplifier of the sense component 130-b (e.g., electrically equivalent with such a location), and the second node 132-b may also be coupled with or between (e.g., located between) the sense amplifier and the memory cell 105-b.

In some examples, the first node 131-b may be electrically equivalent to the input/output line 290-a, and the second node 132-b may be electrically equivalent to input/output line 290-b. In other examples, the first node 131-b and the second node 132-b may refer to other portions of a sense component 130, and may or may not be electrically equivalent to input/output lines 290.

In the example of circuit 400, the sense component 130-b may include a high voltage portion 470 and a low voltage portion 480. The high voltage portion 470 may include components having a relatively higher voltage isolation characteristic, and the low voltage portion 480 may include components having a relatively lower voltage isolation characteristic. In various examples of the sense component 130-b, the described voltage isolation characteristic may refer to one or more properties, or combinations of properties, of the components of the high voltage portion 470 and the low voltage portion 480.

For example, the voltage isolation characteristics may refer to an isolation voltage, an activation threshold voltage (e.g., a threshold voltage of one or more transistors), a degree of insulation between a transistor gate and a transistor body, a degree of insulation between a source and drain of associated transistors, a gate insulation thickness, or other examples of voltage isolation characteristics. Further, the described voltage isolation characteristics may refer to a nominal characteristic or a threshold characteristic (e.g., an upper threshold, a lower threshold), and may also include or otherwise account for variations due to manufacturing tolerances, operational tolerances, or any other sources of variation from the nominal or threshold voltage isolation characteristic.

The high voltage portion 470 may be selectively coupled or decoupled with the memory cell 105-b (e.g., by activating or deactivating the selection component 430-d) via the bypass line 270-a and the digit line 210-a. The low voltage portion 480 may be selectively coupled with the amplifier component 280-a (e.g., by activating or deactivating the switching component 420-h) via the signal line 260-a, and the low voltage portion 480 and the amplifier component 280-a may also be selectively coupled or decoupled with the memory cell 105-b (e.g., by activating or deactivating the selection component 430-d) via the digit line 210-a. The low voltage portion 480 may be coupled with the output node 453 of the differential amplifier 450 via a switching component 420-h that may have the relatively lower voltage isolation characteristic.

The high voltage portion 470 may, in some examples, include a pair of cross-coupled p-type transistors 471-a and 471-b, each having the relatively higher voltage isolation characteristic. For example, the pair of cross-coupled p-type transistors 471-a and 471-b may have a relatively high gate insulation thickness. The cross-coupled p-type transistors 471-a and 471-b may be coupled with a voltage source 410-k via a switching component 420-i having the relatively higher voltage isolation characteristic. The switching component 420-i may be activated or deactivated by a logical signal $SW_2$. The voltage source 410-k may have a voltage $V_{10}$, which may represent a high sense component source voltage of the sense component 130-b. In some examples, the voltage level $V_{10}$ may be selected to support writing operations of the memory cell 105-b (e.g., supporting a saturation polarization of the memory cell 105-b).

The high voltage portion 470 may also include a pair of n-type transistors 472-a and 472-b, each having the relatively higher voltage characteristic, and configured in a clamping configuration. For example, the gate terminals of each of the n-type transistors 472-a and 472-b may be coupled with a variable voltage source 440-c (e.g., providing different voltages, supporting a voltage being enabled and disabled or grounded).

In various examples, the variable voltage source 440-c may be used for access operations (e.g., read operations, write operations), including those operations described with reference to hysteresis plots 300-a and 300-b of FIG. 3. For example, the variable voltage source 440-c may represent a sense amplifier clamping voltage source, and may be used to selectively couple or isolate the high voltage portion 470 and the low voltage portion 480. The variable voltage source 440-c may include a voltage source 410-l having a voltage $V_{11}$ (e.g., a voltage source having a voltage that is below a threshold, a voltage that is relatively lower than $V_1$) and a voltage source 410-m having a voltage $V_{12}$ (e.g., a voltage source having a voltage that is above a threshold, a voltage that is relatively higher than $V_{11}$), and one of the voltage source 410-l or the voltage source 410-m may be selectively coupled with the pair of n-type transistors 472-a and 472-b via a selection component 430-c, which may be activated or deactivated by a logical signal $SW_3$. In other words, the high voltage portion 470 and the low voltage portion 480 may be selectively coupled or isolated (e.g., selectively permitting passage of signals between them or preventing passage of signals between them) by activating or deactivating logical signal $SW_{13}$.

The voltage $V_2$ may be selected such that signals passing from the high voltage portion 470 to the low voltage portion 480 are limited based at least in part on the voltage level $V_{12}$ (e.g., limited to a level of $V_{12}-V_{th,clamp}$, where $V_{th,clamp}$ is equal to the activation threshold voltage of the n-type transistors 472-a or 472-b). In some examples, the voltage V 2 may be selected to be substantially equal to (e.g., coupled with the same voltage supply as) the voltage $V_{10}$. The pair of cross-coupled n-type transistors 472-a and 472-b may have a relatively high gate insulation thickness, which may be substantially (e.g., nominally) the same gate insulation thickness, or at least as thick as a minimum gate insulation thickness as the pair of cross-coupled p-type transistors 471-a and 471-b.

The low voltage portion 480 may be coupled with the input/output line 290-a and the input/output line 290-b, which in some examples may include a selective coupling (e.g., via other switching components 420, not shown, which may have the relatively lower voltage isolation characteristic). The low voltage portion 480 may also include a pair of amplifiers 481-a and 481-b, each having the relatively lower voltage isolation characteristic. In some examples, the illustrated configuration of the low voltage portion 480 may be referred to as a low-voltage latch. In some examples, the pair of amplifiers 481-a and 481-b may refer to, or may be otherwise replaced with a pair of cross-coupled n-type transistors, each having the relatively lower voltage isolation characteristic.

For example, such a pair of cross-coupled n-type transistors may have a relatively low gate insulation thickness, as compared with the transistors 471 or 472 of the high voltage portion 470. In some examples, the use of amplifiers 481 having the lower voltage isolation characteristic may be enabled by the described configurations of the differential amplifier 450. For example, the use of amplifiers 481 may be based at least in part on limiting the charge sharing between the sense component 130-b and the memory cell 105-b enabled by the described configurations of the differential amplifier 450.

The amplifier 481-a may be coupled with a voltage source 410-n via a switching component 420-j having the relatively lower voltage isolation characteristic, and the switching component 420-j may be activated or deactivated by a logical signal $SW_4$. The voltage source 410-n may have a voltage $V_{13}$, which may represent a low sense amplifier source voltage of the sense component 130-b. The amplifier 481-b may be coupled with a voltage source 410-o via a switching component 420-k having the relatively lower voltage isolation characteristic, and the switching component 420-k may be activated or deactivated by a logical signal $SW_{15}$. The voltage source 410-o may have a voltage $V_{14}$, which may represent a sense amplifier ground voltage of the sense component 130-b, and may be coupled with a same ground or virtual ground as, for example, voltage source 410-a, voltage source 410-b, voltage source 410-d, voltage source 410-f, voltage source 410-h, voltage source 410-l, or a combination thereof.

In some examples, the voltage $V_{13}$ of the voltage source 410-n may be relatively lower than a voltage of other latch configurations, and the use of the relatively lower voltage of the voltage source 410-n may be enabled by the described configurations of a differential amplifier 450. In other words, by using the described configurations of a differential amplifier 450, a sense component 130 may be able to use lower voltage supplies, which may enable the lower power consumption associated with such supplies, and avoid charge leakage associated with relatively higher voltage supplies.

In some examples, activating $SW_4$, $SW_{15}$, or both may be referred to as "enabling" or "activating" the sense component 130-b. In some examples, activating $SW_{14}$, $SW_{15}$, or both may be referred to, or be part of an operation known as "latching" the result of accessing the memory cell 105-b. In some examples, logical signals $SW_{14}$ and $SW_{15}$ may be provided by the same logical signal (e.g., by a memory controller), or logical signals $SW_{14}$ and $SW_{15}$ may be shared in a different manner, or logical signals $SW_{14}$ and $SW_{15}$ may otherwise be substantially the same logical signal.

In various examples, the switching components 420 or the selection components 430 illustrated in or coupled with the high voltage portion 470 may be transistors, and the respective logical signals may be supplied to the gate terminal of the respective transistor. In such examples, the transistors of the switching components 420 or the selection components 430 may have substantially the same voltage isolation characteristics as the n-type transistors 472-a and 472-b, or the p-type transistors 471-a and 471-b. For example, the gate insulation thickness of the transistors of the switching component 420-i or the selection components 430-c or 430-d may be substantially the same as, or at least as thick as a minimum thickness of the relatively high gate insulation thickness of the n-type transistors 472 or the p-type transistors 471.

Additionally or alternatively, the switching components 420 or the selection components 430 illustrated in or coupled with the low voltage portion 480 may be transistors, and the respective logical signals may be supplied to the gate terminal of the respective transistor. In such examples, the transistors of the switching components 420 or the selection components 430 may have substantially the same voltage isolation characteristics as the amplifiers 481-a or 481-b. For example, the gate insulation thickness of the transistors of switching components 420-h, 420-j, or 420-k may be substantially the same as, or at least as thick as the minimum thickness of the insulation of the amplifiers 481, which may be less than the relatively high gate insulation thickness of the n-type transistors 472 or the p-type transistors 471.

Although the sense component 130-b is illustrated as having a high voltage portion 470 and a low voltage portion 480, various other configurations of a sense component 130 may be used to support the described differential amplifier schemes for sensing memory cells. For example, an amplifier component 280 may be coupled with a sense component 130 having components with substantially the same voltage isolation characteristics throughout the sense component 130. Additionally or alternatively, an amplifier component 280 may be provided with other signal generation components that support accessing a memory cell 105 that are not shown in circuit 400. For example, such additional components may be located (e.g., coupled) between a memory cell 105 and the amplifier component 280, between a sense component 130 and the amplifier component 280, along a bypass line 270, electrically in parallel with the amplifier component 280, or various combinations thereof.

Although the sense component 130-b, the amplifier component 280-a, and the variable voltage sources 440 are illustrated with respective dashed lines as reflecting particular boundaries, such boundaries are shown for illustrative purposes only. In other words, any one or more of a sense component 130, an amplifier component 280, or a variable voltage source 440 in accordance with the present disclosure may have boundaries different than the dashed boundaries shown in the circuit 400. For example, a sense component 130 may have a first node 131 and a second node 132 substantially at the boundary of the sense component 130, such that a common access line is divided into separate branches outside the sense component 130. Further, in some examples, a sense component 130 or an amplifier component 280 may or may not include voltage sources or other voltage supplies, such that the voltage sources or voltage supplies may be within the illustrative boundaries or outside the illustrative boundaries.

Each of the logical signals (e.g., $SW_1$ through $SW_{16}$ and WL) illustrated in circuit 400 may be provided by a memory controller (not shown), such as a memory controller 150 described with reference to FIG. 1. In some examples, certain logical signals may be provided by other components. For example, logical signal WL may be provided by a row decoder (not shown), such as a row decoder 125 described with reference to FIG. 1.

In some examples, the voltage sources 410-n and 410-o may be selected according to particular input or output parameters. For example, voltage sources 410-*n* and 410-*o* may be substantially at 1V and 0V (e.g., $V_{13}$=1V and $V_{14}$=0V), which may support certain I/O component conventions such as certain DRAM or FeRAM conventions.

In various examples, voltage sources 410 may be coupled with different configurations of voltage supplies and/or common grounding or virtual grounding points of a memory device that may include the example circuit 400. For example, in some embodiments, voltage sources 410-*a*, 410-*b*, 410-*d*, 410-*f*, 410-*h*, 410-*l*, or 410-*o*, or any combination thereof, may be coupled with the same ground point or virtual ground point, and may provide substantially the same reference voltage for various operations of accessing the memory cell 105-*b*. Specifically, in some examples, voltage sources 410-*b* and 410-*h* may be configured to provide a same voltage, which may support equalizing a voltage across the memory cell 105-*b* after applying a read voltage (e.g., after applying a read voltage 335 as described with reference to FIG. 3, related to the differential amplifier 450 being configured to equalize a voltage between the first input node 451 and the second input node 452).

In some examples, two or more of the voltage sources 410 may be coupled with a same voltage supply of a memory device. For example, voltage sources 410-*c* and 410-*e* may be coupled with a same voltage supply having a certain voltage (e.g., a voltage of 1.5V, which may be referred to as "VMSI"). Additionally or alternatively, in some examples, voltage sources 410-*k* and 410-*m* may be coupled with a same voltage supply having a certain voltage (e.g., a voltage of 1.5V, which may be referred to as "VMSI"). Accordingly, in some examples, the voltage sources 410-*c*, 410-*c*, 410-*k*, and 410-*m* may all be coupled with the same voltage supply (e.g., $V_2$, $V_4$, $V_{10}$, and $V_2$ may be substantially equal).

Although voltage sources 410 may be coupled with common voltage supplies and/or grounding points, the voltage at each of the voltage sources 410 coupled with a common voltage supply or common grounding point may be different due to various differences in the circuit 400 (e.g., conductor length, conductor width, conductor resistance, conductor or other capacitance) between the respective voltage sources 410 and the associated common voltage supply or common grounding point.

Figure 5:
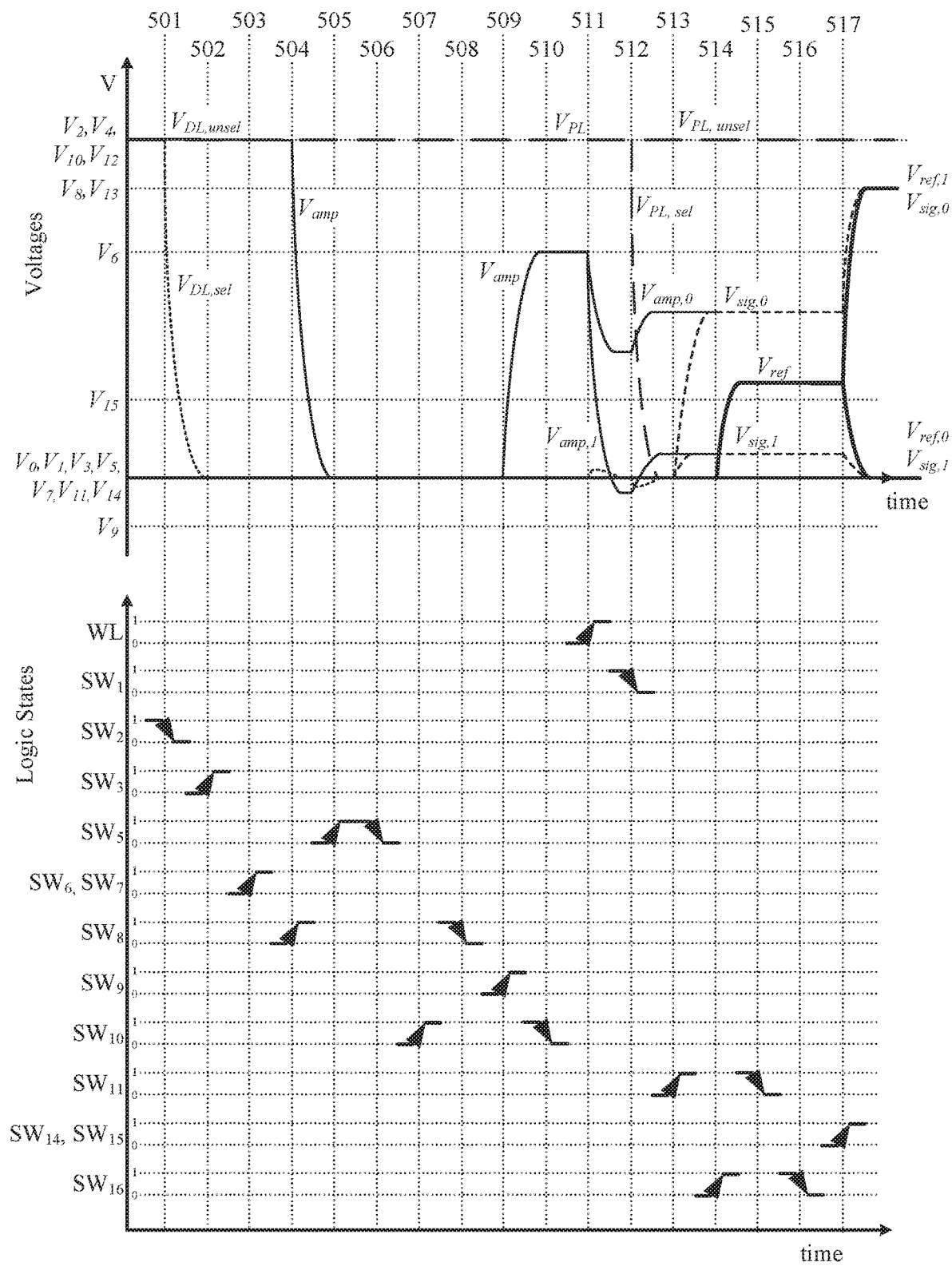
FIG. 5 shows a timing diagram illustrating operations of an example read operation that supports differential amplifier sensing schemes for non-switching state compensation in accordance with examples as disclosed herein.

FIG. 5 shows a timing diagram 500 illustrating operations of an example read operation that supports differential amplifier sensing schemes for non-switching state compensation in a memory device in accordance with examples as disclosed herein. The timing diagram 500 is described with reference to components of the example circuit 400 of FIG. 4, but may be illustrative of operations that may be performed with different circuit arrangements as well.

In the example of timing diagram 500, memory cell 105-*b* may initially store a logic state (e.g., a logic 0 state, a logic 1 state) as described herein (e.g., with reference to FIG. 3). The signals of the read operation illustrated in the timing diagram 500 are therefore shown as alternatives associated with reading the different logic states, as indicated by a subscript 0 or a subscript 1 (e.g., as associated with the respective logic states) where such signals are different.

In the example of timing diagram 500, voltage sources 410-*a*, 410-*b*, 410-*d*, 410-*f*, 410-*h*, 410-*l*, and 410-*o* may be grounded (e.g., according to a ground or virtual ground), and are therefore at a zero voltage (e.g., $V_0$=0V, $V_1$=0V, $V_3$=0V, $V_5$=0V, $V_7$=0V, $V_{11}$=0V, and $V_{14}$=0V). However, in other examples one or more of the voltage sources 410-*a*, 410-*b*, 410-*d*, 410-*f*, 410-*h*, 410-*l*, or 410-*o* may be at non-zero voltages, and the voltages illustrated by the timing diagram 500 may thus be adjusted accordingly.

In some examples, prior to initiating the operations of timing diagram 500, the digit lines 210 for idle memory cells 105 (e.g., deselected memory cells 105 of a memory array that may include the memory cell 105-*b*), including digit line 210-*a*, and the plate line 215-*a* (which may be shared among the memory cells 105 that include the memory cell 105-*b*) may be controlled to the same voltage. Matching the voltage of digit lines 210 and plate lines 215 may minimize charge leakage in a memory array that includes memory cell 105-*b*. For example, in the example of timing diagram 500, the digit line 210-*a* and other digit lines 210 of the memory array may have an initial voltage of 1.5V (e.g., as provided by voltage source 410-*e*), which may be the same as the initial voltage of the plate line 215-*a* and other plate lines of the memory array (e.g., as provided by voltage source 410-*c*).

In some examples, the read operation illustrated by timing diagram 500 may begin with an initial state in which the word line is not selected (e.g., logical signal WL is deactivated), and the digit line 210-*a* is isolated from the equalization voltage source 410-*d* (e.g., logical signal $SW_2$ is deactivated).

In some examples, the read operation illustrated by timing diagram 500 may be performed while the bypass line 270-*a* is disabled, or otherwise isolated from the digit line 210-*a*. For example, the selection component 430-*d* may be activated throughout at least a portion of or all of the time illustrated by the timing diagram 500 (e.g., by activating logical signal $SW_4$), such that the amplifier component 280-*a* is configured to be coupled with the digit line 210-*a* (e.g., via the switching component 420-*a*)

At 501, the read operation may include equalizing the digit line 210-*a* (e.g., grounding or virtually grounding the digit line 210-*a*, a selected digit line 210). For example, at 501, the read operation may include deactivating the selection component 430-*b* of the variable voltage source 440-*b* (e.g., by deactivating logical signal $SW_2$) which may couple the digit line 210-*a* with an equalization voltage source (e.g., voltage source 410-*d*). Thus, at 501, the voltage of the digit line 210-*a* (e.g., $V_{DL,sel}$) associated with the memory cell 105-*b* may be brought to an equalization voltage (e.g., 0V). In some examples, the digit lines 210 associated with memory cells 105 that are not being read may remain at a first voltage (e.g., an "idle" voltage) through 501 (e.g., $V_{DL,unsel}$ may remain at the voltage $V_4$ after the operations of 501, may remain at the voltage $V_4$ throughout the read operation of the timing diagram 500). Accordingly, as a result of the operations of 501, non-selected plate lines 215 and non-selected digit lines 210 may be maintained at the same voltage, which may support limiting charge leakage and signal degradation in the associated memory array.

At 502, the read operation may include coupling the digit line 210-*a* with the amplifier component 280-*a*. For example, at 502, the read operation may include activating the switching component 420-*a* (e.g., by activating logical signal $SW_3$), which may couple the digit line 210-*a* with the first input node 451 of the differential amplifier 450. In examples where the digit line equalization voltage source (e.g., voltage source 410-*d*) has the same voltage as the differential amplifier reference voltage source (e.g., voltage source 410-*h*), the operations of 502 may be associated with zero current passing through the output node 453 of the differential amplifier 450.

At 503, the read operation may include enabling the differential amplifier 450. For example, at 503, the read operation may include activating the switching component 420-*c* (e.g., by activating logical signal $SW_6$), which may couple the high differential amplifier supply voltage (e.g., voltage source 410-*i*) with the differential amplifier 450. Additionally or alternatively, in some examples, at 503, the read operation may include activating the switching component 420-*d* (e.g., by activating logical signal SW$_7$), which may couple the low differential amplifier supply voltage (e.g., voltage source 410-*j*) with the differential amplifier 450. In some examples, one of the switching component 420-*c* or the switching component 420-*d* may be activated prior to the operations of 503, or either the switching component 420-*c* or the switching component 420-*d* may be omitted, such that enabling the differential amplifier may include one switching component 420 to be activated at 503. In other examples, both the switching component 420-*c* and the switching component 420-*d* may already be enabled, or may be omitted from the circuit 400, in which case the differential amplifier 450 may always be enabled. Accordingly, in some examples, the operations of 503 may be omitted. The operations of 503 may be an example of operations that support coupling one or more supply voltages with a differential amplifier to enable the differential amplifier.

At 504, the read operation may include coupling the output node 453 of the differential amplifier 450 with the first input node 451 of the differential amplifier 450. For example, at 504, the read operation may include activating the switching component 420-*e* (e.g., by activating logical signal SW$_8$), which may couple the output node 453 with the first input node 451. As a result of the operations of 504, the output node 453 of the differential amplifier 450 may be coupled with the digit line equalization voltage source (e.g., voltage source 410-*d*), which in some examples may cause the voltage at the output node 453 to reach the voltage of V$_3$. Thus, in the example of timing diagram 500, where the output node 453 begins at an elevated voltage (e.g., from a prior access operation), the output node 453 may fall to 0V following the operations of 504. The operations of 504 may be an example of operations that support coupling a first input node of a differential amplifier with an output node of the differential amplifier via a feedback line before precharging a capacitor.

In another example, an idle state of the circuit 400 may be associated with the output node 453 of the differential amplifier 450 being coupled with the first input node 451 of the differential amplifier 450. In other words, prior to a read operation, the switching component 420-*e* may already be activated (e.g., where logical signal SW$_8$ being in an activated state is an initial condition of a read operation). In such examples, the operations of 504 may be omitted. Further, in various examples, such as when the idle state of the circuit 400 includes the output node 453 being coupled with the first input node 451, the differential amplifier output voltage V$_{amp}$ may already be at a low or substantially grounded voltage prior to 504. In such examples, the operations of 504 may not be associated with a drop in voltage V$_{amp}$, as illustrated in the example of timing diagram 500.

At 505, the read operation may include equalizing the first input node 451 of the differential amplifier 450. For example, at 505, the read operation may include activating the switching component 420-*b* (e.g., by activating logical signal SW$_5$), which may couple the first input node 451 with the voltage source 410-*f*. Thus, as a result of the operations of 505, the first input node 451 of the differential amplifier 450 may reach the voltage of V$_5$. In some examples (e.g., where V$_5$=V$_3$), the operations of 505 may be omitted, because the first input node 451 may already be equalized with the digit line 210-*a* (e.g., as a result of the operations of 501 and 502). In some examples, the operations of 501 may be omitted, and the operations of 505 may be associated with equalizing both the first input node 451 of the differential amplifier 450 and the digit line 210-*a*.

In another example, an idle state of the circuit 400 may be associated with the input node 451 of the differential amplifier 450 being coupled with an equalization voltage source (e.g., voltage source 410-*f*). In other words, prior to a read operation, the switching component 420-*b* may already be activated (e.g., where logical signal SW$_5$ being in an activated state is an initial condition of a read operation). In such examples, the operations of 505 may be omitted.

At 506, the read operation may include isolating the first input node 451 of the differential amplifier 450 from an equalization voltage source. For example, at 506, the read operation may include deactivating the switching component 420-*b* (e.g., by deactivating logical signal SW$_5$), which may decouple the first input node 451 from the voltage source 410-*f*. Following the operations of 506, the first input node 451 of the differential amplifier 450 may hold at the voltage of V$_5$.

At 507, the read operation may include coupling the second node 462 of the integrator capacitor 460 with a precharge voltage source. For example, at 507, the read operation may include activating the switching component 420-*g* (e.g., by activating logical signal SW$_{10}$), which may couple the second node 462 of the integrator capacitor 460 with the voltage source 410-*g*. As a result of the operations of 507, the second node 462 of the integrator capacitor may reach the voltage of V$_6$. Accordingly, the integrator capacitor 460 may store a charge associated with the voltage difference of (V$_6$–V$_5$), or the voltage difference of (V$_6$–V$_3$), which in some examples may be equivalent. The operations of 507 may be an example of operations that support precharging a capacitor of a memory device, where a first node of the capacitor is coupled with a first input node of a differential amplifier. For example, the operations of 507 may be an example of coupling a second node of a capacitor with a precharge voltage source for precharging the capacitor.

At 508, the read operation may include isolating or disconnecting the output node 453 of the differential amplifier 450 from the first input node 451 of the differential amplifier 450. For example, at 508, the read operation may include deactivating the switching component 420-*e* (e.g., by deactivating logical signal SW$_8$), which may decouple the output node 453 from the first input node 451. In some examples, the operations of 508 may be referred to as isolating or disabling a direct feedback line of the differential amplifier 450. The operations of 508 may be an example of decoupling a first input node of a differential amplifier from an output node of the differential amplifier via a feedback line before precharging a capacitor.

At 509, the read operation may include coupling the output node 453 of the differential amplifier 450 with the second node 462 of the integrator capacitor. For example, at 509, the read operation may include activating the switching component 420-*f* (e.g., by activating logical signal SW$_9$). Based on the operations of 509, the output node 453 of the differential amplifier 450 (e.g., V$_{amp}$) may reach the voltage of V$_6$. The operations of 509 may be an example of coupling a second node of a capacitor with an output node of a differential amplifier after precharging the capacitor. In some examples, the operations of 509 may be omitted, such as when using a circuit configuration in which the nodes 461 and 462 of an integrator capacitor 460 remain coupled with the input node 451 and output node 453 of a differential amplifier 450 throughout a read operation (e.g., when a circuit includes a capacitive feedback line for a differential amplifier 450 that does not include a switching component 420, such as a circuit that replaces the switching component 420-f with a continuous electrical connection).

At 510, the read operation may include isolating the second node 462 of the integrator capacitor 460 from the precharge voltage source. For example, at 510, the read operation may include deactivating the switching component 420-g (e.g., by deactivating logical signal $SW_{10}$), which may decouple the second node 462 of the integrator capacitor 460 from the voltage source 410-g. The operations of 510 may be an example of decoupling a second node of a capacitor from a precharge voltage source after precharging the capacitor Although illustrated by the timing diagram 500 in the context of two separate switching components 420, in some examples, the operations of 509 and 510 may be combined in a circuit that replaces the switching components 420-f and 420-g with a single selection component 430 (not shown). For example, the circuit 400 may be modified to include a selection component 430 configured to selectively couple the second node 462 of the integrator capacitor 460 with one of the output node 453 of the differential amplifier 450 or the voltage source 410-g. In another example, logical signals $SW_9$ and $SW_{10}$ may be provided as a same signal to the switching components 420-f and 420-g, where one of the switching components 420-f or 420-g is a normally-open switch and the other is a normally closed switch. In such examples, the operations of 509 and 510 may be combined such that, by activating or deactivating the selection component 430 of the modified circuit, the read operation may simultaneously couple the output node 453 of the differential amplifier 450 with the second node 462 of the integrator capacitor and isolates the second node 462 of the integrator capacitor 460 from the precharge voltage source.

At 511, the read operation may include selecting the memory cell 105-b. For example, at 511, the read operation may include activating a cell selection component 230 of the memory cell 105-b (e.g., by activating logical signal WL). Selecting the memory cell 105-b may cause a capacitor of the memory cell 105-b to be coupled with the digit line 210-a. Accordingly, the voltage applied across the capacitor (e.g., $V_{cap}$ described with reference to FIG. 3) may initially be equal to ($V_{DL,sel}-V_{PL,sel}$), a negative $V_{cap}$ that may be referred to as a "plate high" read operation. As a result of the operations of 511, charge may be shared between the memory cell 105-b, the digit line 210-a and any intrinsic capacitance of the digit line (e.g., intrinsic capacitance 240-a), and the integrator capacitor 460. The amount of charge shared between the components of the circuit 400 may depend on the logic state (e.g., the charge, polarization) stored in the memory cell 105-b. Charge may be accordingly shared between the memory cell 105-b and the digit line 210-a until reaching an equilibrium digit line voltage $V_{DL,sel}$ for the given plate line voltage $V_{PL,sel}$ (e.g., $V_2$). The operations of 511 may be an example of coupling a memory cell with a first input node of a differential amplifier while a second node of a capacitor is coupled with an output node of the differential amplifier to generate a sense signal.

For example, when the memory cell 105-b stores a logic 1, the capacitor of the memory cell 105-b may store a positive charge by way of a positive polarization (e.g., a charge state 305-a as described with reference to FIG. 3). Thus, when memory cell 105-b storing a logic 1 is selected, a relatively large amount of charge may flow from the memory cell 105-b to the digit line 210-a. The relatively large amount of charge flowing to the digit line 210-a may accordingly result in a relatively large rise in digit line voltage $V_{DL,sel}$. As the digit line voltage $V_{DL,sel}$ rises, the voltage at the first input node 451 of the differential amplifier 450 may accordingly rise above the voltage of the second input node 452 (e.g., $V_7$). In response to the difference in voltage at the input nodes 451 and 452, the differential amplifier 450 may be configured to generate or supply a negative current at the output node 453 (e.g., charge flowing into the output node 453). The negative current may refer to charge flowing out from the second node 462 of the integrator capacitor 460, through the differential amplifier 450, and into the differential amplifier low voltage source 410-j (e.g., a negative voltage source). Accordingly, the voltage at the second node 462 of the integrator capacitor 460 (e.g., $V_{amp}$) may drop.

In response to the drop in voltage at the second node 462 of the integrator capacitor 460, charge may flow from the digit line 210-a into the first node 461 of the integrator capacitor 460, and accordingly $V_{DL,sel}$ may also drop. The negative current may continue until the voltage at the first input node 451 and the voltage at the second input node 452 equalize (e.g., when the digit line voltage $V_{DL,sel}$ returns to 0V, when the digit line voltage $V_{DL,sel}$ matches the differential amplifier reference voltage $V_7$). In the example of reading a logic 1, which is associated with a relatively large amount of charge passing from the memory cell 105-b to the digit line 210-a, the drop in voltage $V_{amp}$ at the output node 453 of the differential amplifier 450 as a result of selecting the memory cell at 511 may be relatively large (e.g., resulting in a relatively low signal voltage from accessing the memory cell 105-b). As a result of the operations of 511, the memory cell 105-b originally storing a logic 1 may transition to a negatively saturated charge state (e.g., charge state 370 as described with reference to FIG. 3).

Alternatively, when the memory cell 105-b stores a logic 0, the capacitor of the memory cell 105-b may store a negative charge by way of a negative polarization (e.g., a charge state 310-a as described with reference to FIG. 3). Thus, when memory cell 105-b storing a logic 0 is selected, a relatively small amount of charge may flow from the memory cell 105-b to the digit line 210-a. The relatively small amount of charge flowing to the digit line 210-a may accordingly result in a relatively small rise in digit line voltage $V_{DL,sel}$. As the digit line voltage $V_{DL,sel}$ rises, the voltage at the first input node 451 of the differential amplifier 450 may accordingly rise above the voltage of the second input node 452 (e.g., $V_7$). In response to the difference in voltage at the input nodes 451 and 452, the differential amplifier 450 may be configured to generate or supply a negative current at the output node 453 (e.g., charge flowing into the output node 453). The negative current may refer to charge flowing out from the second node 462 of the integrator capacitor 460, through the differential amplifier 450, and into the differential amplifier low voltage source 410-j (e.g., a negative voltage source). Accordingly, the voltage at the second node 462 of the integrator capacitor 460 (e.g., $V_{amp}$) may drop.

In response to the drop in voltage at the second node 462 of the integrator capacitor 460, charge may flow from the digit line 210-a into the first node 461 of the integrator capacitor 460, and accordingly $V_{DL,sel}$ may also drop. The negative current may continue until the voltage at the first input node 451 and the voltage at the second input node 452 equalize (e.g., when the digit line voltage $V_{DL,sel}$ returns to 0V, when the digit line voltage $V_{DL,sel}$ matches the differential amplifier reference voltage $V_7$). In the example of reading a logic 0, which is associated with a relatively small amount of charge passing from the memory cell 105-b to the digit line 210-a, the drop in voltage $V_{amp}$ at the output node 453 of the differential amplifier 450 as a result of selecting the memory cell at 511 may be relatively small (e.g., resulting in a relatively high signal voltage from accessing the memory cell 105-b, such as a negative voltage as illustrated). As a result of the operations of 511, the memory cell 105-b originally storing a logic 0 may transition to a negatively saturated charge state (e.g., charge state 370 as described with reference to FIG. 3).

At 512, the read operation may include equalizing the plate line 215-a (e.g., grounding or virtually grounding the plate line 215-a, a selected plate line). For example, at 512, the read operation may include deactivating the selection component 430-a of the variable voltage source 440-a (e.g., by deactivating logical signal $SW_1$), which may couple the plate line 215-a with an equalization voltage source (e.g., voltage source 410-b). At 512, the voltage of the plate line 215-a (e.g., $V_{PL,sel}$) associated with the memory cell 105-b may be brought to an equalization voltage (e.g., $V_1=0V$). In some examples (e.g., when a memory array includes independently-addressable or otherwise isolated plate lines 215), the plate lines 215 associated with memory cells 105 that are not being read may be at a first voltage (e.g., an "idle" voltage) through 512 (e.g., may remain at the voltage $V_2$ after the operations of 512, may remain at the voltage $V_2$ throughout the read operation of the timing diagram 500). Accordingly, as a result of the operations of 512, non-selected plate lines 215 and non-selected digit lines 210 may continue to be at the same voltage, which may help to limit charge leakage and signal degradation in the associated memory array. In some examples (e.g., when the plate line 215-a is illustrative of a common plate or common plate node of a memory array), the cell plate 221 of other memory cells 105 in the memory array may be equalized as well, in which case a voltage difference may be present between a common plate and non-selected digit lines 210.

In response to the reduction of plate line voltage, $V_{PL,sel}$, the voltage of the digit line, $V_{DL,sel}$, may also fall (e.g., while $V_{cap}$ is initially maintained). As the digit line voltage $V_{DL,sel}$ falls, the voltage at the first input node 451 of the differential amplifier 450 may accordingly fall below the voltage of the second input node 452 (e.g., $V_7$). In response to the difference in voltage at the input nodes 451 and 452, the differential amplifier 450 may be configured to generate or supply a positive current at the output node 453 (e.g., charge flowing out of the output node 453). The positive current may refer to charge flowing out of the differential amplifier high voltage source 410-i (e.g., a positive voltage source), through the differential amplifier 450, and into the second node 462 of the integrator capacitor 460. Accordingly, the voltage at the second node 462 of the integrator capacitor 460 (e.g., $V_{amp}$) may rise.

In response to the rise in voltage at the second node 462 of the integrator capacitor 460, charge may flow from first node 461 of the integrator capacitor and into the digit line 210-a, and accordingly $V_{DL,sel}$ may also rise. The positive current may continue until the voltage at the first input node 451 and the voltage at the second input node 452 equalize (e.g., when the digit line voltage $V_{DL,sel}$ returns to 0V, when the digit line voltage $V_{DL,sel}$ matches the differential amplifier reference voltage $V_7$). When the differential amplifier reference voltage, $V_7$, is equal to the plate line equalization voltage, $V_1$, the memory cell 105-b may be at an equalized charge state (e.g., a charge state 310-a, where $V_{PL,sel}=V_{DL,sel}$) as a result of the operations of 512.

In the example of reading either a logic 1 or a logic 0, a same amount of charge may be returned to the memory cell 105-b. For example, the memory cell 105-b may be at a same charge state (e.g., charge state 370) before the operations of 512 for both logic states, and the memory cell may also be at a same charge state (e.g., charge state 310-a) as a result of the operations of 512. Accordingly, by performing the operations of 512, and equalizing a voltage across the memory cell 105-b, the non-switching state of the memory cell 105-b may be compensated for, and recoil characteristics or displacement components associated with accessing the memory cell 105-b, and any associated variability, may be reduced or eliminated.

At 513, the read operation may include coupling the amplifier component 280-a with the sense component 130-b. For example, at 513, the read operation may include activating the switching component 420-h (e.g., by activating logical signal $SW_{11}$), which may couple the output node 453 of the differential amplifier 450 with the signal node (e.g., first node 131-b) of the sense component 130-b. Thus, as a result of the operations of 513, the first node 131-b of the sense component may reach a signal voltage based at least in part on the signal generated at the output node 453 of the differential amplifier 450. For example, charge may be shared between the amplifier component 280-a and the sense component 130-b such that the voltage at the first node 131-b (e.g., $V_{sig}$) reaches the voltage at the output node 453 of the differential amplifier 450 (e.g., $V_{amp}$). As a result of the configuration of the differential amplifier 450, charge sharing between the memory cell 105-b and the sense component 130-b may be reduced, or substantially eliminated, as compared with other circuit configurations used to read a memory cell.

At 514, the read operation may include coupling a reference voltage source with the sense component 130-b. For example, at 514, the read operation may include activating the switching component 420-l (e.g., by activating logical signal $SW_{16}$), which may couple the voltage source 410-p with the reference node (e.g., second node 132-b) of the sense component 130-b. Thus, as a result of the operations of 514, the second node 132-b of the sense component may reach the reference voltage of $V_{15}$.

In other examples of differential amplifier schemes that support self-referencing read operations (not shown), the illustrated operations at 514 may be replaced with one or more operations that develop a reference signal using the memory cell 105-b, which may or may not involve operations of the amplifier component 280-a.

At 515, the read operation may include isolating the amplifier component 280-a from the sense component 130-b. For example, at 515, the read operation may include deactivating the switching component 420-h (e.g., by deactivating logical signal $SW_{11}$), which may isolate the output node 453 of the differential amplifier 450 from the first node 131-b of the sense component 130-b.

At 516, the read operation may include isolating the reference voltage source from the sense component 130-b. For example, at 516, the read operation may include deactivating the switching component 420-l (e.g., by deactivating logical signal $SW_{16}$), which may isolate the voltage source 410-p from the reference node (e.g., second node 132-b) of the sense component 130-b.

At 517, the read operation may include latching the result of detecting the logic state stored by the memory cell 105-b. For example, at 517, the read operation may include activating the switching components 420-j and 420-k (e.g., by activating logical signals $SW_{14}$ and $SW_{15}$), which may couple the sense component voltage source 410-*n* with the amplifier 481-*a* and couple the sense component voltage source 410-*o* with the amplifier 481-*b*. As a result of the operations of 517, the first node 131-*b* and the second node 132-*b* may reach one of the voltages provided by the sense component voltage sources 410, depending on the detected logic state stored by the memory cell 105-*b*. For example, when the memory cell 105-*b* stores a logic 1, $V_{sig,1}$, may be higher than $V_{ref}$. Thus, when reading a logic 1, $V_{sig}$ may change to match the relatively higher amplifier source voltage $V_{13}$ and $V_{ref}$ may change to match the relatively lower amplifier source voltage $V_{14}$. When the memory cell 105-*b* stores a logic 0, $V_{sig,0}$ may be lower than $V_{ref}$. Thus, when reading a logic 0, $V_{ref}$ may change to match the relatively higher amplifier source voltage $V_{13}$ and $V_{sig}$ may change to match the relatively lower amplifier source voltage $V_{14}$. The operations of 517 may be an example of determining a logic state stored by a memory cell based at least in part on a generated sense signal.

In various examples of a read operation in accordance with the present disclosure, components or logical signals may be returned to an idle state or transitioned to some other initial condition prior to a subsequent access operation (e.g., prior to a subsequent refresh operation, prior to a subsequent read operation, prior to a subsequent write operation). In various examples, transitioning to an idle state or other initial condition may be considered to be part of the read operation, or may be referred to as a transitional operation.

In examples where the differential amplifier 450 is disabled or otherwise powered down in an idle state or a subsequent initial condition, the switching component 420-*c*, the switching component 420-*d*, or both may be deactivated (e.g., by deactivating one or both of logical signals $SW_6$ or $SW_7$) following the operations illustrated in the timing diagram 500.

In examples where the first input node 451 of the differential amplifier 450 is coupled with the output node 453 of the differential amplifier 450 in an idle state or a subsequent initial condition, the switching component 420-*e* may be activated (e.g., by activating logical signal $SW_8$) following the operations illustrated in the timing diagram 500.

In examples where the output node 453 of the differential amplifier 450 is decoupled from the integrator capacitor 460 in an idle state or a subsequent initial condition, the switching component 420-*f* may be deactivated (e.g., by deactivating logical signals $SW_9$) following the operations illustrated in the timing diagram 500.

In examples where the first input node 451 of the differential amplifier 450 is coupled with an equalization voltage source (e.g., voltage source 410-*f*) in an idle state or a subsequent initial condition, the switching component 420-*b* may be activated (e.g., by activating logical signal SW) following the operations illustrated in the timing diagram 500.

The read operation illustrated by the timing diagram 500 may be an example of a "high voltage idle" operation, in which, prior to the operations of timing diagram 500, memory cells 105 of an array are held at a relatively high voltage (e.g., via connected digit lines 210 and plate lines 215). For example, prior to the operations of timing diagram 500, memory cells 105 may be held at a high plate line voltage (e.g., $V_{PL}=V_2$) and a high digit line voltage (e.g., $V_{DL}=V_4$). These conditions may be returned to after the read operation illustrated in timing diagram 500. In other words, logical signals $SW_1$ and $SW_2$ may be activated following the operations illustrated in the timing diagram 500.

In other examples of read operations that support the described differential amplifier schemes, memory cells 105 may be held at a relatively low voltage or ground voltage. For example, prior to the operations of timing diagram 500, memory cells 105 may be held at a low plate line voltage (e.g., $V_{PL}=V_1$, which may be aground voltage) and a low digit line voltage (e.g., $V_{DL}=V_2$, which may be a ground voltage).

In a first alternative example, memory cells 105 may be held at a low plate line voltage (e.g., $V_{PL}=V_1$, which may be a ground voltage) and a low digit line voltage (e.g., $V_{DL}=V_2$, which may be a ground voltage) prior to a read operation. In the first alternative example, a read operation may commence by switching to a high plate line voltage (e.g., $V_{PL}=V_2$), which may affect all memory cells 105 of the array that are connected with a same plate line voltage source. To maintain an approximately zero bias across unselected memory cells 105 connected with the same plate line voltage source, the read operation may also include switching to a high digit line voltage (e.g., $V_{DL,unsel}=V_4$) for those memory cells 105 of the array that are not selected. Accordingly, the selected memory cell 105 (e.g., memory cell 105-*b*) may have a differential read voltage (e.g., $V_2-V_3$), while the other memory cells 105 may have no net voltage (e.g., $V_2-V_4$, which may be zero) across them. In some examples, the remaining operations of the timing diagram 500 (e.g., operations of 502 through 515) may be performed as described.

In a second alternative example, memory cells 105 may be held at a low plate line voltage (e.g., $V_{PL}=V_1$, which may be a ground voltage) and a low digit line voltage (e.g., $V_{DL}=V_3$, which may be a ground voltage) prior to a read operation. In the second alternative example, the read operation may commence by first switching to both a high plate line voltage (e.g., $V_{PL}=V_2$), which may affect all memory cells 105 connected with the same plate line voltage source, and also switching to a high digit line voltage (e.g., $V_{DL}=V_4$) for all the memory cells 105 connected with the same plate line voltage source. Accordingly, all the memory cells 105 may continue to have no net voltage (e.g., $V_2-V_4$, which may be zero) across them, but the voltage of the array as a whole may be increased. Subsequently, the digit line voltage $V_{DL}$, for a selected memory cell 105 (e.g., memory cell 105-*b*) may be dropped to a low digit line voltage (e.g., $V_3$) while the remaining memory cells 105 are held with a high digit line voltage (e.g., $V_4$). In some examples, the remaining operations of the timing diagram 500 (e.g., operations of 502 through 515) may be performed as described.

The read operation of timing diagram 500 illustrates one example for relative timing between applying a plate high read voltage (e.g., a read voltage 335 described with reference to FIG. 3) relative to other operations for generating a sense signal (e.g., at the output node 453 of the differential amplifier 450, at the first node 131-*b* of the sense component 130-*b*). For example, the read operation of timing diagram 500 illustrates an example where a plate high read voltage is applied before coupling the capacitor 460 with the output node 453 of the differential amplifier 450, and before coupling the memory cell 105-*b* with the digit line 210-*a* (e.g., performing the operations of 501 before the operations of 509 and 510). In another example of applying a plate high read voltage before coupling the capacitor 460 with the output node 453 of the differential amplifier 450, the digit line 210-*a* and the plate line 215-*a* may begin a read operation at a low or equalized voltage (e.g., $V_{DL}=V_{PL}=0V$), and the plate line 215-*a* may be biased with a high voltage (e.g., $V_2$, activating the switching component 430-*a*) before coupling the capacitor 460 with the output node 453 of the differential amplifier 450. However, other examples of relative timing may be possible, and leverage different configurations of a memory array (e.g., different plate configurations).

In some examples, a read operation in accordance with the described techniques may include applying a plate high read voltage across the memory cell 105-b after coupling the capacitor 460 with the output node 453 of the differential amplifier 450, or after coupling the memory cell 105-b with the digit line 210-a. For example, the digit line 210-a and the plate line 215-a may begin a read operation at a low or equalized voltage (e.g., $V_{DL}=V_{PL}=0V$), and the plate line 215-a may be biased with a high voltage (e.g., $V_2$, activating the switching component 430-a) after coupling the capacitor 460 with the output node 453 of the differential amplifier 450, or after coupling the memory cell 105-b with the digit line 210-a (e.g., after the operations of 509, before the operations of 512).

In some examples, such a technique may be supported when the memory cell 105-b is coupled with an independently addressable plate line (e.g., where the plate line 215-a is isolated from another plate line 215 accessed by the same word line 205-a), which may include raising $V_{PL,sel}$ and $V_{PL,unsel}$ after coupling the capacitor 460 with the output node 453 of the differential amplifier 450. In some examples, such a technique may be supported when the memory cell 105-b is coupled with a common plate of a memory array (e.g., where cell plates 221 of memory cells 105 are coupled or connected across rows and columns of memory cells 105), which may include raising a common voltage, $V_{PL}$, after coupling the capacitor 460 with the output node 453 of the differential amplifier 450.

In some examples, applying a plate-high read voltage across the memory cell 105-b after coupling the capacitor 460 with the output node 453 of the differential amplifier 450, or after coupling the memory cell 105-b with the digit line 210-a, may have advantages. For example, in the operations illustrated in the timing diagram 500, a duration over which the voltage is different between the digit line 210-a and the plate line 215-a (e.g., from 501 to 512) is relatively long. When the plate line 215-a is illustrative of a common plate, this relatively long duration may result in sense signal degradation or logic state degradation due to parasitic plate coupling into the selected digit line 210-a. Such conditions may be associated with relatively high variation in sense signals or poor read margins (e.g., high bit error rates). Thus, delaying an application of a plate-high read voltage across the memory cell 105-b (e.g., delaying a plate-high read voltage until after 509 or after 511) may reduce a duration over which the voltage is different between the digit line 210-a and the common plate, which may be associated with an improvement in read margins when the memory cell 105-b is coupled with a common plate. Although described in the context of a common plate, applying a plate-high read voltage across the memory cell 105-b after coupling the capacitor 460 with the output node 453 of the differential amplifier 450, or after coupling the memory cell 105-b with the digit line 210-a, may also be beneficial in configurations with independently-addressable or otherwise isolated plate lines.

Although illustrated as separate operations occurring at different times, certain operations may occur simultaneously, or in a different order. In some examples, various operations may be advantageously initiated simultaneously to reduce the amount of time for sensing a logic state of the memory cell 105-b. For example, any two or more of the equalizing of the digit line 210-a of 501, the coupling of the digit line 210-a with the amplifier component of 502, the enabling of the differential amplifier 450 of 503, or the coupling of the output node 453 of the differential amplifier 450 with the first input node of the differential amplifier 450 of 504, may occur in a different relative order, occur during overlapping durations, or occur simultaneously. Additionally or alternatively, the coupling of the amplifier component 280-a with the sense component 130-b of 513 and the coupling of the reference voltage source with the sense component 130-b of 514 may occur in a different order, occur during overlapping durations, or occur simultaneously. Additionally or alternatively, the decoupling of the amplifier component 280-a from the sense component 130-b of 515 and the decoupling of the reference voltage source from the sense component 130-b of 516 may occur in a different order, occur during overlapping durations, or occur simultaneously.

The order of operations shown in timing diagram 500 is for illustration only, and various other orders and combinations of steps may be performed to support differential amplifier schemes for sensing memory cells in accordance with the present disclosure. Further, the timing of the operations of the timing diagram 500 is also for illustration purposes only, and is not meant to indicate a particular relative duration between one operation and another. Various operations may occur over a duration that is relatively shorter or relatively longer than illustrated in various examples of differential amplifier schemes for non-switching state compensation in accordance with the present disclosure.

The transitions of the logical signals of the timing diagram 500 are illustrative of transitions from one state to another, and generally reflect transitions between a disabled or deactivated state (e.g., state "0") and an enabled or activated state (e.g., state "1") as associated with a particular numbered operation. In various examples the states may be associated with a particular voltage of the logical signal (e.g., a logical input voltage applied to a gate of a transistor operating as a switch), and the change in voltage from one state to another may not be instantaneous. Rather, in some examples, a voltage associated with a logical signal may follow a ramping behavior, or time-constant (e.g., logarithmic or exponential) behavior over time from one logical state to another.

In some examples, the transition of a component from one state to another may be based at least in part on characteristics of the associated logical signal, including the voltage level of the logical signal or the transition characteristics of the logical signal itself. Thus, the transitions shown in timing diagram 500 are not necessarily indicative of an instantaneous transition. Further, the initial state of a logical signal associated with a transition at a numbered operation may have been arrived during various times preceding the numbered operation while still supporting the described transitions and associated operations. Although logical signals are shown as a transition between logical states, the voltage of a logical signal may be selected to operate a component at a particular working point (e.g., in an active region or in a saturation region), and may be the same as, or different from a voltage of other logical signals.

Figure 6:
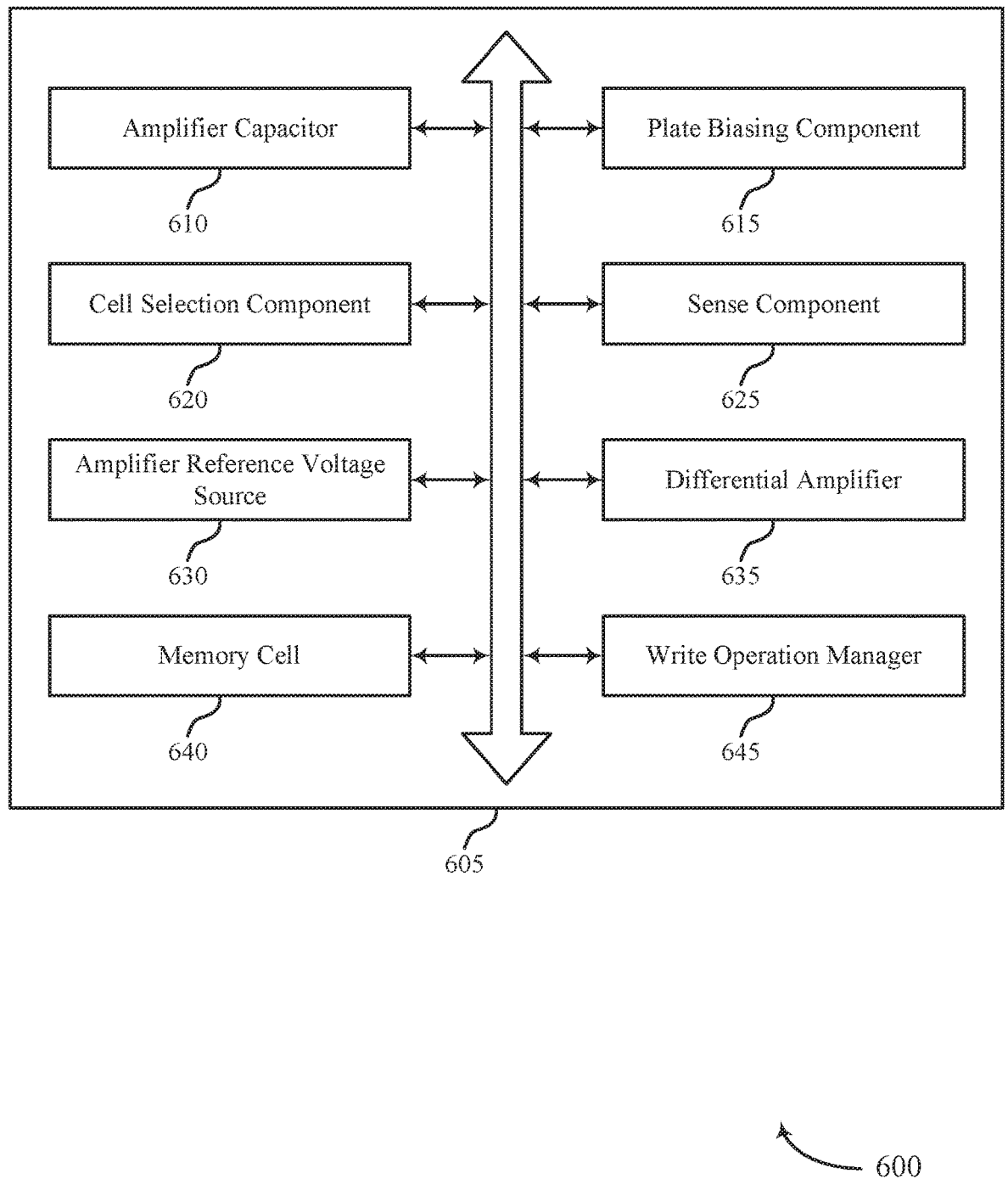
FIG. 6 shows a block diagram of a memory device that supports differential amplifier sensing schemes for non-switching state compensation in a memory device in accordance with aspects of the present disclosure.

FIG. 6 shows a block diagram 600 of a memory device 605 that supports differential amplifier sensing schemes for non-switching state compensation in a memory device in accordance with examples as disclosed herein. The memory device 605 may be an example of aspects of a memory device as described with reference to FIGS. 1 through 5. The memory device 605 may include an amplifier capacitor 610, a plate biasing component 615, a cell selection component 620, a sense component 625, an amplifier reference voltage source 630, a differential amplifier 635, a memory cell 640, and a write operation manager 645. Each of these modules may communicate, directly or indirectly, with one another (e.g., via one or more buses).

The amplifier capacitor 610 may be coupled with an input of the differential amplifier 635, and may be precharged in accordance with examples as disclosed herein.

The plate biasing component 615 may bias a first node of the memory cell 640 with a first voltage. In some examples, generating a sense signal may be based on the plate biasing component 615 biasing the first node of the memory cell 640 with a second voltage while the second node of the memory cell 640 is coupled with the input of the differential amplifier 635 (e.g., and while the capacitor is coupled with the output of the differential amplifier 635). In some cases, the first voltage has a greater magnitude than the second voltage. In some cases, the second voltage is a ground voltage.

In some examples, the plate biasing component 615 may bias the first node of the memory cell 640 with the first voltage before coupling the amplifier capacitor 610 with the output of the differential amplifier 635. In some examples, the plate biasing component 615 may bias the first node of the memory cell 640 with the first voltage after coupling the amplifier capacitor 610 with the output of the differential amplifier 635.

In some examples, the plate biasing component 615 may bias an independently-addressable plate line of the memory array with the first voltage. In some examples, the plate biasing component 615 may bias one or more other independently-addressable plate lines of the memory array with the first voltage while the plate line is biased with the second voltage. In some examples, the plate biasing component 615 may bias a plate that is common to the memory cells of the memory array with the first voltage.

The cell selection component 620 may couple a second node of the memory cell 640 with the input of the differential amplifier 635 while the first node of the memory cell 640 is biased with the first voltage (e.g., and while the capacitor is coupled with the output of the differential amplifier 635).

The sense component 625 may determine a logic state stored by the memory cell 640 based on the sense signal. In some examples, the output of the differential amplifier 635 may be coupled with a first node of a sense component 625 while the second node of the memory cell 640 is biased with the second voltage. In some examples, the sense component 625 may latch a difference between a reference voltage and a voltage of the first node of the sense component 625 that is based on the coupling of the output of the differential amplifier 635 with the first node of the sense component 625.

In some examples, coupling the output of the differential amplifier 635 with the sense component 625 includes coupling the output with a first portion of the sense component 625, the first portion of the sense component 625 associated with a first voltage isolation characteristic. In some examples, coupling the memory cell 640 with the sense component 625 via the access line that bypasses the differential amplifier 635 includes coupling the memory cell 640 with a second portion of the sense component 625, the second portion of the sense component 625 associated with a second voltage isolation characteristic that is higher than the first voltage isolation characteristic.

In some examples, the amplifier capacitor 610 may be coupled with an output of the differential amplifier 635 after precharging the amplifier capacitor 610. In some examples, the amplifier capacitor 610 may be coupled with an output of the differential amplifier 635 before precharging the amplifier capacitor 610. In some examples, the input of the differential amplifier 635 may be decoupled from the output of the differential amplifier 635 via the feedback line before precharging the amplifier capacitor 610. In some cases, a current at the output of the differential amplifier 635 is proportional to a difference between a voltage at the input of the differential amplifier 635 and a voltage at a second input of the differential amplifier 635.

The amplifier reference voltage source 630 may bias a second input of the differential amplifier 635 with the second voltage while the second node of the memory cell 640 is coupled with the input of the differential amplifier 635 and while the first node of the memory cell 640 is biased with the second voltage.

In some cases, the memory cell 640 includes a ferroelectric storage element that is different than the amplifier capacitor 610.

The write operation manager 645 may perform a write operation on the memory cell 640, where the write operation includes coupling the memory cell 640 with the sense component 625 via an access line that bypasses the differential amplifier 635.

Figure 7:
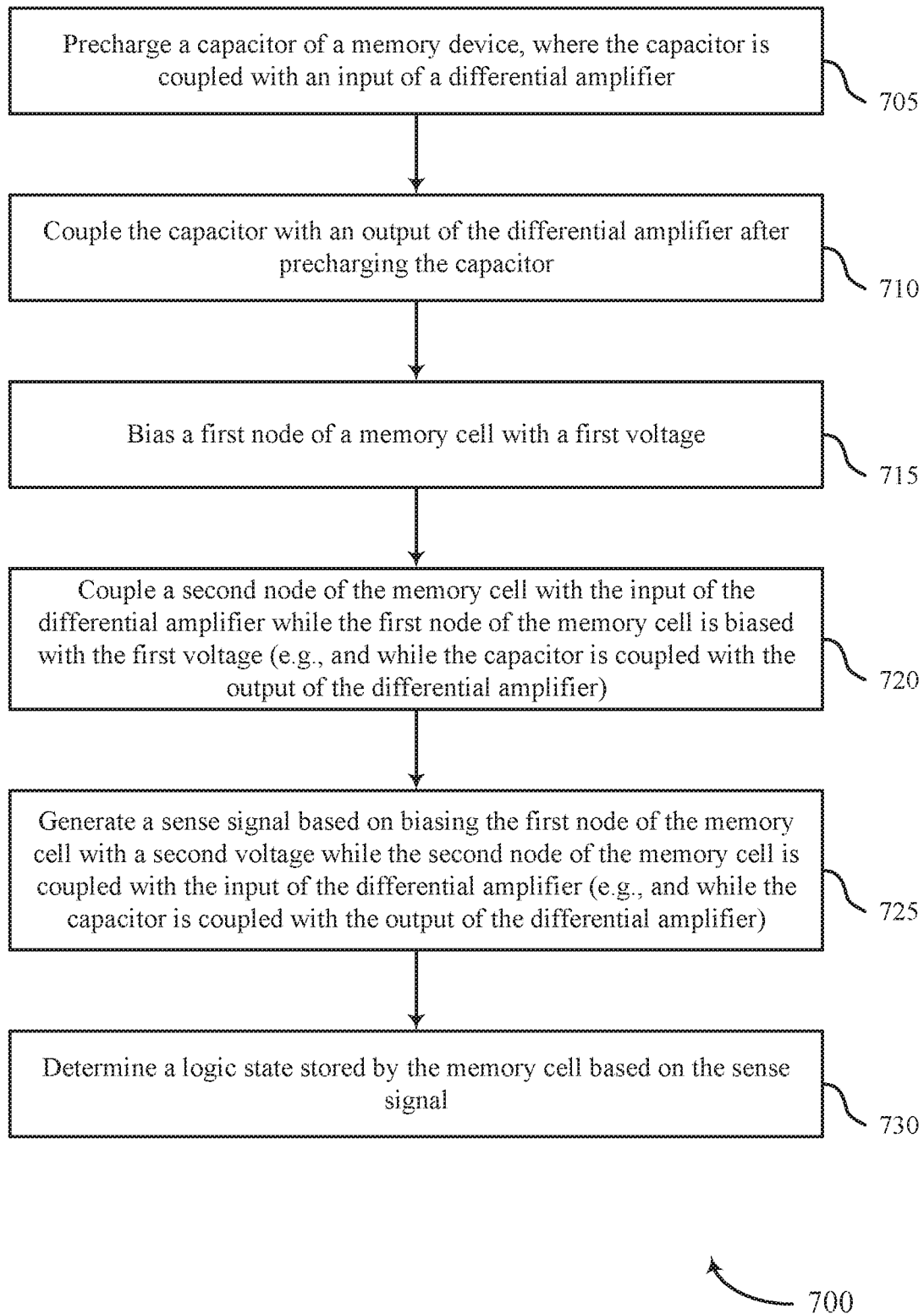
FIGS. 7 and 8 show flowcharts illustrating a method or methods that support differential amplifier sensing schemes for non-switching state compensation in a memory device in accordance with examples as disclosed herein.

FIG. 7 shows a flowchart illustrating a method or methods 700 that supports differential amplifier sensing schemes for non-switching state compensation in a memory device in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may precharge a capacitor of a memory device, where the capacitor is coupled with an input of a differential amplifier. The operations of 705 may be performed according to the methods described herein. In some examples, aspects of the operations of 705 may be performed by an amplifier capacitor as described with reference to FIG. 6.

At 710, the memory device may couple the capacitor with an output of the differential amplifier after precharging the capacitor. The operations of 710 may be performed according to the methods described herein. In some examples, aspects of the operations of 710 may be performed by a differential amplifier as described with reference to FIG. 6.

At 715, the memory device may bias a first node of a memory cell with a first voltage. The operations of 715 may be performed according to the methods described herein. In some examples, aspects of the operations of 715 may be performed by a plate biasing component as described with reference to FIG. 6.

At 720, the memory device may couple a second node of the memory cell with the input of the differential amplifier while the first node of the memory cell is biased with the first voltage (e.g., and while the capacitor is coupled with the output of the differential amplifier). The operations of 720 may be performed according to the methods described herein. In some examples, aspects of the operations of 720 may be performed by a cell selection component as described with reference to FIG. 6.

At 725, the memory device may generate a sense signal based on biasing the first node of the memory cell with a second voltage while the second node of the memory cell is coupled with the input of the differential amplifier (e.g., and while the capacitor is coupled with the output of the differential amplifier). The operations of 725 may be performed according to the methods described herein. In some examples, aspects of the operations of 725 may be performed by a plate biasing component as described with reference to FIG. 6.

At 730, the memory device may determine a logic state stored by the memory cell based on the sense signal. The operations of 730 may be performed according to the methods described herein. In some examples, aspects of the operations of 730 may be performed by a sense component as described with reference to FIG. 6.

In some examples, an apparatus as described herein may perform a method or methods, such as the method 700. The apparatus may include features, circuitry, means, or instructions (e.g., a non-transitory computer-readable medium storing instructions executable by a processor) for precharging a capacitor of a memory device, where the capacitor is coupled with an input of a differential amplifier, coupling the capacitor with an output of the differential amplifier after precharging the capacitor, biasing a first node of a memory cell with a first voltage, coupling a second node of the memory cell with the input of the differential amplifier while the first node of the memory cell is biased with the first voltage (e.g., and while the capacitor is coupled with the output of the differential amplifier), generating a sense signal based on biasing the first node of the memory cell with a second voltage while the second node of the memory cell is coupled with the input of the differential amplifier (e.g., and while the capacitor is coupled with the output of the differential amplifier), and determining a logic state stored by the memory cell based on the sense signal.

Some examples of the method 700 and the apparatus described herein may further include operations, features, circuitry, means, or instructions for biasing a second input of the differential amplifier with the second voltage while the second node of the memory cell may be coupled with the input of the differential amplifier and while the first node of the memory cell may be biased with the second voltage.

In some examples of the method 700 and the apparatus described herein, biasing the first node of the memory cell with the first voltage may include operations, features, circuitry, means, or instructions for biasing the first node of the memory cell with the first voltage before coupling the capacitor with the output of the differential amplifier.

In some examples of the method 700 and the apparatus described herein, biasing the first node of the memory cell with the first voltage may include operations, features, circuitry, means, or instructions for biasing the first node of the memory cell with the first voltage after coupling the capacitor with the output of the differential amplifier.

In some examples of the method 700 and the apparatus described herein, the memory cell may be one of a set of memory cells of a memory army having capacitive storage elements coupled with a plate line of the memory array, and biasing the first node of the memory cell with the first voltage may include operations, features, circuitry, means, or instructions for biasing the plate line of the memory array with the first voltage.

Some examples of the method 700 and the apparatus described herein may further include operations, features, circuitry, means, or instructions for biasing one or more other plate lines of the memory array with the first voltage while the plate line may be biased with the second voltage.

In some examples of the method 700 and the apparatus described herein, the memory cell may be one of a set of memory cells of a memory array, each memory cell of the memory array having a respective second node that may be coupled with a plate that may be common to the memory cells of the memory array, and biasing the first node of the memory cell with the first voltage may include operations, features, circuitry, means, or instructions for biasing the plate that may be common to the memory cells of the memory array with the first voltage.

In some examples of the method 700 and the apparatus described herein, determining the logic state stored by the memory cell may include operations, features, circuitry, means, or instructions for coupling the output of the differential amplifier with a first node of a sense component while the second node of the memory cell may be biased with the second voltage, and latching a difference between a reference voltage and a voltage of the first node of the sense component that may be based on the coupling of the output of the differential amplifier with the first node of the sense component.

In some examples of the method 700 and the apparatus described herein, the first voltage may have a greater magnitude than the second voltage.

In some examples of the method 700 and the apparatus described herein, the second voltage may be a ground voltage.

In some examples of the method 700 and the apparatus described herein, a current at the output of the differential amplifier may be proportional to a difference between a voltage at the input of the differential amplifier and a voltage at a second input of the differential amplifier.

In some examples of the method 700 and the apparatus described herein, the memory cell includes a ferroelectric storage element that is different than the capacitor of the memory device.

Some examples of the method 700 and the apparatus described herein may further include operations, features, circuitry, means, or instructions for coupling the input of the differential amplifier with the output of the differential amplifier via a feedback line before precharging the capacitor.

Some examples of the method 700 and the apparatus described herein may further include operations, features, circuitry, means, or instructions for decoupling the input of the differential amplifier from the output of the differential amplifier via the feedback line before precharging the capacitor.

Some examples of the method 700 and the apparatus described herein may further include operations, features, circuitry, means, or instructions for performing a write operation on the memory cell, and the write operation may include coupling the memory cell with a sense component via an access line that bypasses the differential amplifier.

In some examples of the method 700 and the apparatus described herein, coupling the output of the differential amplifier with the sense component may include operations, features, circuitry, means, or instructions for coupling the output with a first portion of the sense component, the first portion of the sense component associated with a first voltage isolation characteristic.

In some examples of the method 700 and the apparatus described herein, coupling the memory cell with the sense component via the access line that bypasses the differential amplifier may include operations, features, circuitry, means, or instructions for coupling the memory cell with a second portion of the sense component, the second portion of the sense component associated with a second voltage isolation characteristic that may be higher than the first voltage isolation characteristic.

Figure 8:
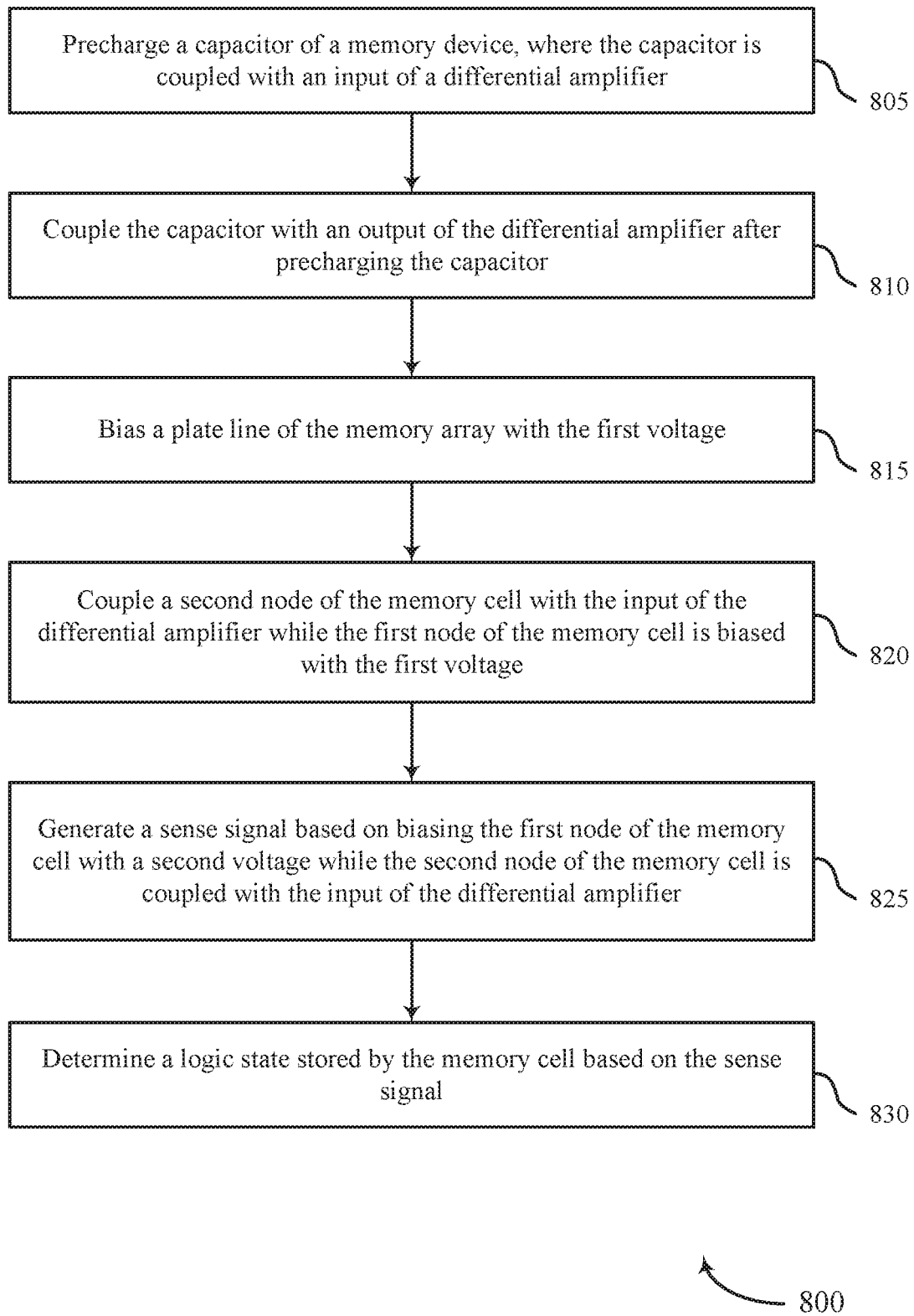

FIG. 8 shows a flowchart illustrating a method or methods 800 that supports differential amplifier sensing schemes for non-switching state compensation in a memory device in accordance with aspects of the present disclosure. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may precharge a capacitor of a memory device, where the capacitor is coupled with an input of a differential amplifier. The operations of 805 may be performed according to the methods described herein. In some examples, aspects of the operations of 805 may be performed by an amplifier capacitor as described with reference to FIG. 6.

At 810, the memory device may couple the capacitor with an output of the differential amplifier after precharging the capacitor. The operations of 810 may be performed according to the methods described herein. In some examples, aspects of the operations of 810 may be performed by a differential amplifier as described with reference to FIG. 6.

At 815, the memory device may bias a first node of a memory cell with a first voltage by biasing a plate line of the memory array with the first voltage. For example, the memory cell may be one of a set of memory cells of a memory array having capacitive storage elements coupled with the plate line. The operations of 815 may be performed according to the methods described herein. In some examples, aspects of the operations of 815 may be performed by a plate biasing component as described with reference to FIG. 6.

At 820, the memory device may couple a second node of the memory cell with the input of the differential amplifier while the first node of the memory cell is biased with the first voltage (e.g., and while the capacitor is coupled with the output of the differential amplifier). The operations of 820 may be performed according to the methods described herein. In some examples, aspects of the operations of 820 may be performed by a cell selection component as described with reference to FIG. 6.

At 825, the memory device may generate a sense signal based on biasing the first node of the memory cell with a second voltage while the second node of the memory cell is coupled with the input of the differential amplifier (e.g., and while the capacitor is coupled with the output of the differential amplifier). In some examples, the memory device may bias one or more other plate lines of the memory array with the first voltage while the plate line is biased with the second voltage. The operations of 825 may be performed according to the methods described herein. In some examples, aspects of the operations of 825 may be performed by a plate biasing component as described with reference to FIG. 6.

At 830, the memory device may determine a logic state stored by the memory cell based on the sense signal. The operations of 830 may be performed according to the methods described herein. In some examples, aspects of the operations of 830 may be performed by a sense component as described with reference to FIG. 6.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a set of first access lines that are each independently addressable, a set of second access lines that each correspond to a respective one of the set of first access lines, a memory cell having a capacitive storage element coupled with one of the set of first access lines, the capacitive storage element configured to be selectively coupled with the one of the set of second access lines, a sense component, a differential amplifier having an input configured to be coupled with the memory cell and having an output configured to be coupled with the sense component, and a switching component configured to selectively couple the output with the input across a capacitor.

In some examples, to generate a sense signal associated with a logic state of the memory cell, the apparatus may be configured to bias the one of the set of first access lines, while the capacitive storage element of the memory cell is selectively coupled with the one of the set of second access lines corresponding to the one of the set of first access lines, with a first voltage, and bias the one of the set of first access lines, after the biasing with the first voltage and while the capacitive storage element of the memory cell is selectively coupled with the one of the set of second access lines corresponding to the one of the set of first access lines, with a second voltage that is different than the first voltage.

In some examples, to generate a sense signal associated with a logic state of the memory cell, the apparatus may be configured to bias the one of the set of first access lines, while the capacitive storage element of the memory cell is selectively coupled with the one of the set of second access lines corresponding to the one of the set of first access lines, with a first voltage that is different than a bias applied to a second input of the differential amplifier, and bias the one of the set of first access lines, while the capacitive storage element of the memory cell is selectively coupled with the one of the set of second access lines corresponding to the one of the set of first access lines, with a second voltage that is equal to the bias applied to the second input of the differential amplifier.

Some examples of the apparatus may include a second memory cell having a second capacitive storage element coupled with a second one of the set of first access lines, the second capacitive storage element configured to be selectively coupled with the one of the set of second access lines corresponding to the second one of the set of first access lines, and a third access line operable to selectively couple the capacitive storage element with the one of the set of second access lines corresponding to the one of the set of first access lines, and to selectively couple the second capacitive storage element with the one of the set of second access lines corresponding to the second one of the set of first access lines.

In some examples, the second capacitive storage element may be isolated from the capacitive storage element.

In some examples, to generate a sense signal associated with a logic state of the memory cell, the apparatus may be configured to bias the one of the set of first access lines, while the third access line is activated, with a first voltage, and bias the second one of the set of first access lines, while the third access line is activated, with a second voltage that is different than the first voltage.

In some examples, the differential amplifier may be configured for a current at the output that is proportional to a difference between a voltage at the input and a voltage at a second input.

In some examples, the differential amplifier may be configured to permit current flow into the output when a voltage at the input is higher than a voltage of the second input.

In some examples, the capacitive storage element includes a ferroelectric material.

Some examples of the apparatus may include a third switching component configured to selectively couple the sense component with the memory cell via an access line that bypasses the differential amplifier.

Some examples of the apparatus may include an amplifier reference voltage source coupled with a second input node of the differential amplifier.

Some examples of the apparatus may include a second switching component configured to selectively couple the output with the input via a direct feedback line.

In some examples, the switching component and the second switching component may be configured to receive the same logical signal.

An apparatus is described. The apparatus may include a memory cell, a sense component, a differential amplifier including a first input, a second input, and an output, a capacitor coupled with the first input, and a memory controller. The memory controller may be operable to couple the capacitor with the output of the differential amplifier after precharging the capacitor, bias a first node of a memory cell with a first voltage, couple a second node of the memory cell with the input of the differential amplifier while the first node of the memory cell is biased with the first voltage, generate a sense signal based on biasing the first node of the memory cell with a second voltage while the second node of the memory cell is coupled with the input of the differential amplifier, and determine a logic state stored by the memory cell based on the sense signal.

In some examples, the memory controller may be operable to bias a second input of the differential amplifier with the second voltage while the second node of the memory cell is coupled with the input of the differential amplifier and while the first node of the memory cell is biased with the second voltage.

In some examples, to bias the first node of the memory cell with the first voltage, the memory controller may be operable to bias the first node of the memory cell with the first voltage before coupling the capacitor with the output of the differential amplifier.

In some examples, to bias the first node of the memory cell with the first voltage, the memory controller may be operable to bias the first node of the memory cell with the first voltage after coupling the capacitor with the output of the differential amplifier.

In some examples, the differential amplifier may be configured for a current at the output that is proportional to a difference between a voltage at the first input and a voltage at the second input.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    precharging a capacitor of a memory device, wherein the capacitor is coupled with an input of a differential amplifier;
    coupling the capacitor with an output of the differential amplifier after precharging the capacitor;
    biasing a first node of a memory cell with a first voltage;
    coupling a second node of the memory cell with the input of the differential amplifier while the first node of the memory cell is biased with the first voltage;
    generating a sense signal based at least in part on biasing the first node of the memory cell with a second voltage while the second node of the memory cell is coupled with the input of the differential amplifier; and
    determining a logic state stored by the memory cell based at least in part on the sense signal.

2. The method of claim 1, further comprising:
    biasing a second input of the differential amplifier with the second voltage while the second node of the memory cell is coupled with the input of the differential amplifier and while the first node of the memory cell is biased with the second voltage.

3. The method of claim 1, wherein biasing the first node of the memory cell with the first voltage comprises:
biasing the first node of the memory cell with the first voltage before coupling the capacitor with the output of the differential amplifier.

4. The method of claim 1, wherein biasing the first node of the memory cell with the first voltage comprises:
biasing the first node of the memory cell with the first voltage after coupling the capacitor with the output of the differential amplifier.

5. The method of claim 1, wherein the memory cell is one of a set of memory cells of a memory array having capacitive storage elements coupled with a plate line of the memory array, and wherein biasing the first node of the memory cell with the first voltage comprises:
biasing the plate line of the memory array with the first voltage.

6. The method of claim 5, further comprising:
biasing one or more other plate lines of the memory array with the first voltage while the plate line is biased with the second voltage.

7. The method of claim 1, wherein the memory cell is one of a set of memory cells of a memory array, each memory cell of the set of memory cells of the memory array having a respective second node that is coupled with a plate that is common to the set of memory cells of the memory array, and wherein biasing the first node of the memory cell with the first voltage comprises:
biasing the plate that is common to the set of memory cells of the memory array with the first voltage.

8. The method of claim 1 wherein determining the logic state stored by the memory cell comprises:
coupling the output of the differential amplifier with a first node of a sense component while the second node of the memory cell is biased with the second voltage; and
latching a difference between a reference voltage and a voltage of the first node of the sense component that is based at least in part on the coupling of the output of the differential amplifier with the first node of the sense component.

9. The method of claim 1, wherein the first voltage has a greater magnitude than the second voltage.

10. The method of claim 1, wherein the second voltage is a ground voltage.

11. The method of claim 1, wherein a current at the output of the differential amplifier is proportional to a difference between a voltage at the input of the differential amplifier and a voltage at a second input of the differential amplifier.

12. The method of claim 1, wherein the memory cell comprises a ferroelectric storage element that is different than the capacitor of the memory device.

13. An apparatus, comprising:
a plurality of first access lines that are each independently addressable;
a plurality of second access lines that each correspond to a respective one of the plurality of first access lines;
a memory cell having a capacitive storage element coupled with one of the plurality of first access lines, the capacitive storage element configured to be selectively coupled with the one of the plurality of second access lines;
a sense component;
a differential amplifier having an input configured to be coupled with the memory cell and having an output configured to be coupled with the sense component; and
a switching component configured to selectively couple the output with the input across a capacitor.

14. The apparatus of claim 13, wherein, to generate a sense signal associated with a logic state of the memory cell, the apparatus is configured to:
bias the one of the plurality of first access lines, while the capacitive storage element of the memory cell is selectively coupled with the one of the plurality of second access lines corresponding to the one of the plurality of first access lines, with a first voltage; and
bias the one of the plurality of first access lines, after the biasing with the first voltage and while the capacitive storage element of the memory cell is selectively coupled with the one of the plurality of second access lines corresponding to the one of the plurality of first access lines, with a second voltage that is different than the first voltage.

15. The apparatus of claim 13, wherein, to generate a sense signal associated with a logic state of the memory cell, the apparatus is configured to:
bias the one of the plurality of first access lines, while the capacitive storage element of the memory cell is selectively coupled with the one of the plurality of second access lines corresponding to the one of the plurality of first access lines, with a first voltage that is different than a bias applied to a second input of the differential amplifier; and
bias the one of the plurality of first access lines, while the capacitive storage element of the memory cell is selectively coupled with the one of the plurality of second access lines corresponding to the one of the plurality of first access lines, with a second voltage that is equal to the bias applied to the second input of the differential amplifier.

16. The apparatus of claim 13, further comprising:
a second memory cell having a second capacitive storage element coupled with a second one of the plurality of first access lines, the second capacitive storage element configured to be selectively coupled with the one of the plurality of second access lines corresponding to the second one of the plurality of first access lines;
a third access line operable to selectively couple the capacitive storage element with the one of the plurality of second access lines corresponding to the one of the plurality of first access lines, and to selectively couple the second capacitive storage element with the one of the plurality of second access lines corresponding to the second one of the plurality of first access lines.

17. The apparatus of claim 16, wherein the second capacitive storage element is isolated from the capacitive storage element.

18. The apparatus of claim 16, to generate a sense signal associated with a logic state of the memory cell, the apparatus is configured to:
bias the one of the plurality of first access lines, while the third access line is activated, with a first voltage; and
bias the second one of the plurality of first access lines, while the third access line is activated, with a second voltage that is different than the first voltage.

19. The apparatus of claim 13, wherein the differential amplifier is configured for a current at the output that is proportional to a difference between a voltage at the input and a voltage at a second input.

20. The apparatus of claim 13, wherein the capacitive storage element comprises a ferroelectric material.

21. An apparatus comprising: a memory cell; a sense component; a differential amplifier comprising a first input, a second input, and an output;
   a capacitor coupled with the first input; and
   a memory controller operable to:
      precharge the capacitor;
      couple the capacitor with the output of the differential amplifier after precharging the capacitor;
      bias a first node of the memory cell with a first voltage;
      couple a second node of the memory cell with the first input of the differential amplifier while the first node of the memory cell is biased with the first voltage;
      generate a sense signal based at least in part on biasing the first node of the memory cell with a second voltage while the second node of the memory cell is coupled with the first input of the differential amplifier; and
      determine a logic state stored by the memory cell based at least in part on the sense signal.

22. The apparatus of claim 21, wherein the memory controller is operable to:
   bias the second input of the differential amplifier with the second voltage while the second node of the memory cell is coupled with the first input of the differential amplifier and while the first node of the memory cell is biased with the second voltage.

23. The apparatus of claim 21, wherein, to bias the first node of the memory cell with the first voltage, the memory controller is operable to:
   bias the first node of the memory cell with the first voltage before coupling the capacitor with the output of the differential amplifier.

24. The apparatus of claim 21, wherein, to bias the first node of the memory cell with the first voltage, the memory controller is operable to:
   bias the first node of the memory cell with the first voltage after coupling the capacitor with the output of the differential amplifier.

25. The apparatus of claim 21, wherein the differential amplifier is configured for a current at the output that is proportional to a difference between a voltage at the first input and a voltage at the second input.

* * * * *